(12) United States Patent
Kim et al.

(10) Patent No.: US 9,373,698 B2
(45) Date of Patent: Jun. 21, 2016

(54) METHODS OF MANUFACTURING SEMICONDUCTOR DEVICES AND ELECTRONIC DEVICES

(71) Applicant: Samsung Electronics Co., Ltd., Suwon-si (KR)

(72) Inventors: Tae-Sun Kim, Hwaseong-si (KR); Jae-Kyung Seo, Yongin-si (KR); Ji-Ho Kim, Suwon-si (KR); Kwang-Sub Yoon, Yongin-si (KR); Bum-Joon Youn, Suwon-si (KR); Ki-Man Lee, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/505,662

(22) Filed: Oct. 3, 2014

(65) Prior Publication Data

US 2015/0187910 A1     Jul. 2, 2015

(30) Foreign Application Priority Data

Dec. 27, 2013    (KR) .................. 10-2013-0165828

(51) Int. Cl.
| H01L 23/52 | (2006.01) |
| H01L 29/66 | (2006.01) |
| H01L 29/78 | (2006.01) |
| H01L 29/165 | (2006.01) |

(Continued)

(52) U.S. Cl.
CPC .. *H01L 29/66636* (2013.01); *H01L 21/823418* (2013.01); *H01L 21/823437* (2013.01); *H01L 29/165* (2013.01); *H01L 29/66545* (2013.01); *H01L 29/7834* (2013.01); *H01L 21/0276* (2013.01); *H01L 29/517* (2013.01)

(58) Field of Classification Search
CPC . H01L 21/266; H01L 21/268; H01L 21/0276; H01L 29/66636; H01L 29/66545
USPC .......... 438/197, 199, 229, 231, 294, 299, 301
See application file for complete search history.

(56) References Cited

U.S. PATENT DOCUMENTS

| 4,600,445 A | * | 7/1986 | Horr | ............... H01L 21/0334 257/372 |
| 6,057,587 A | * | 5/2000 | Ghandehari | ............ G03F 7/091 257/435 |

(Continued)

FOREIGN PATENT DOCUMENTS

| KR | 10-2003-0054802 A | 7/2003 |
| KR | 10-2004-0058968 A | 7/2004 |

(Continued)

*Primary Examiner* — Reema Patel
*Assistant Examiner* — Syed Gheyas
(74) *Attorney, Agent, or Firm* — Muir Patent Law, PLLC

(57) ABSTRACT

In a method of manufacturing a semiconductor device, an isolation layer pattern is formed on a substrate to define a field region covered by the isolation layer pattern and first and second active regions that is not covered by the isolation layer pattern and protrudes from the isolation layer pattern. A first anti-reflective layer is formed on the isolation layer pattern. A first photoresist layer is formed on the first and second active regions of the substrate and the first anti-reflective layer. The first photoresist layer is partially etched to form a first photoresist pattern covering the first active region. Impurities are implanted into the second active region to form a first impurity region.

20 Claims, 42 Drawing Sheets

(51) Int. Cl.
*H01L 21/8234* (2006.01)
*H01L 21/027* (2006.01)
*H01L 29/51* (2006.01)

(56) References Cited

U.S. PATENT DOCUMENTS

| | | | |
|---|---|---|---|
| 7,867,853 | B2 | 1/2011 | Mine |
| 2003/0104710 | A1* | 6/2003 | Visokay .......... H01L 21/823842 438/798 |
| 2003/0228741 | A1* | 12/2003 | Schafbauer .......... H01L 21/266 438/531 |
| 2005/0280098 | A1* | 12/2005 | Shin ................ H01L 21/823814 257/371 |
| 2006/0131656 | A1* | 6/2006 | Shin ..................... H01L 21/265 257/369 |
| 2008/0050897 | A1 | 2/2008 | Kottantharayil |
| 2011/0076843 | A1* | 3/2011 | Huang .................... G03F 7/093 438/585 |
| 2012/0142193 | A1 | 6/2012 | Ogihara et al. |
| 2012/0264305 | A1 | 10/2012 | Nakano |
| 2013/0078772 | A1 | 3/2013 | Yuan et al. |
| 2013/0089987 | A1 | 4/2013 | Gouk et al. |
| 2013/0092656 | A1 | 4/2013 | Doan et al. |
| 2013/0171569 | A1 | 7/2013 | Tachibana et al. |

FOREIGN PATENT DOCUMENTS

| | | |
|---|---|---|
| KR | 10-2006-0028220 A | 3/2006 |
| KR | 10-2006-0105160 A | 10/2006 |
| KR | 10-2010-0031173 A | 3/2010 |

\* cited by examiner

2ND DIRECTION
⊗ → 1ST DIRECTION

2ND DIRECTION
⊗ → 1ST DIRECTION

1ST DIRECTION
⊗ → 2ND DIRECTION

2ND DIRECTION
↳ 1ST DIRECTION

1ST DIRECTION
⊗ — 2ND DIRECTION

1ST DIRECTION
⊗⟶ 2ND DIRECTION

2ND DIRECTION
⊗⟶ 1ST DIRECTION

2ND DIRECTION
⊗⟶ 1ST DIRECTION

1ST DIRECTION
⊗ ⟶ 2ND DIRECTION

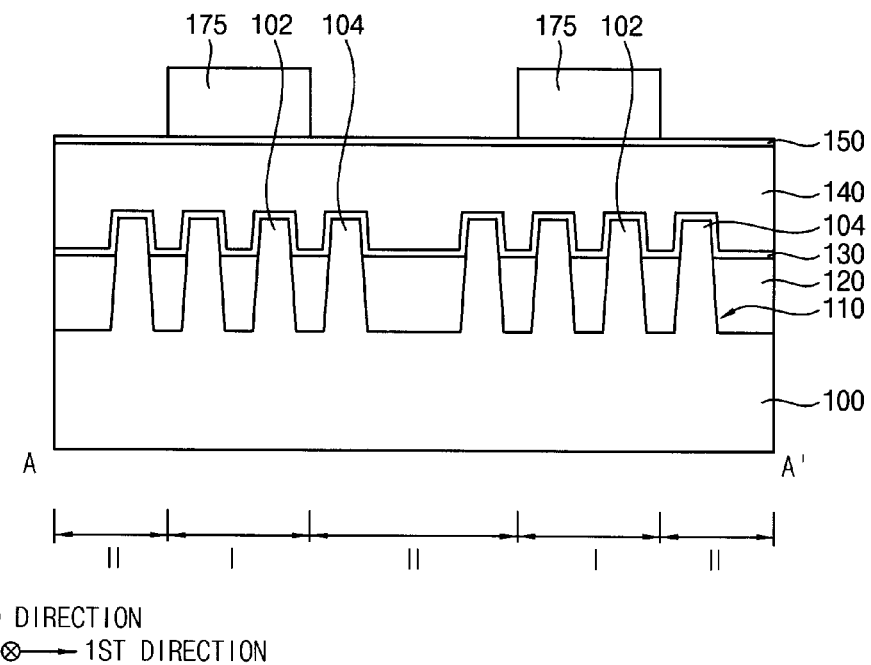
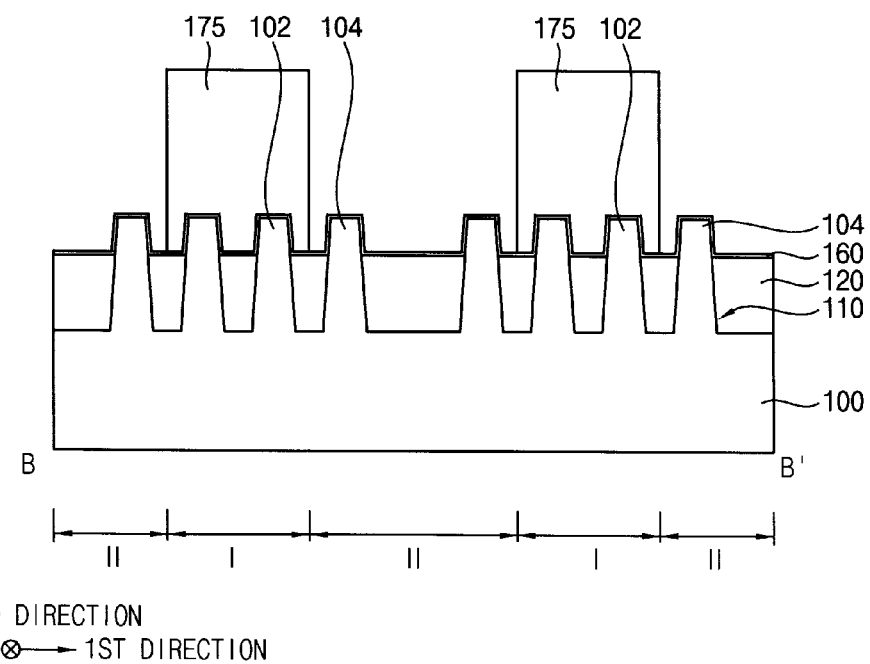

1ST DIRECTION
⊗ ← 2ND DIRECTION

1ST DIRECTION
⊗⟶ 2ND DIRECTION

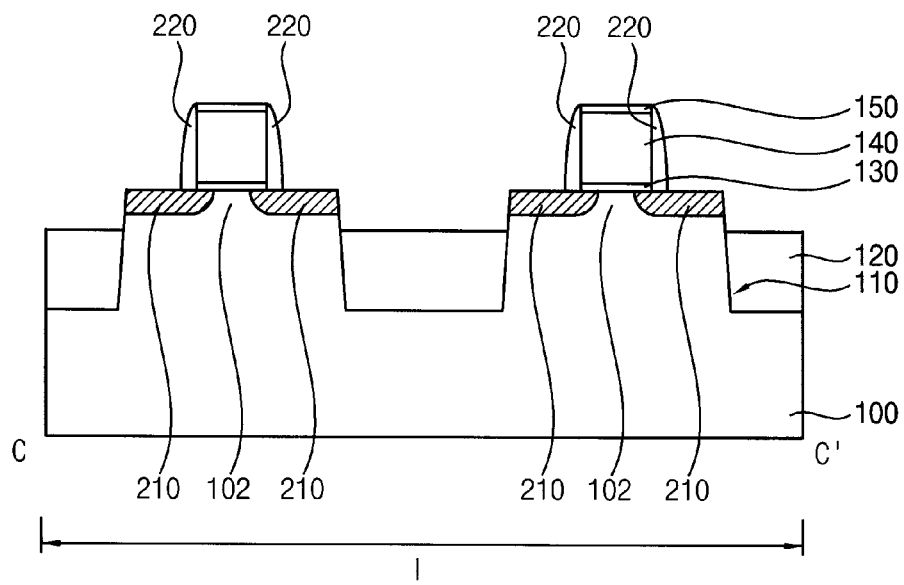
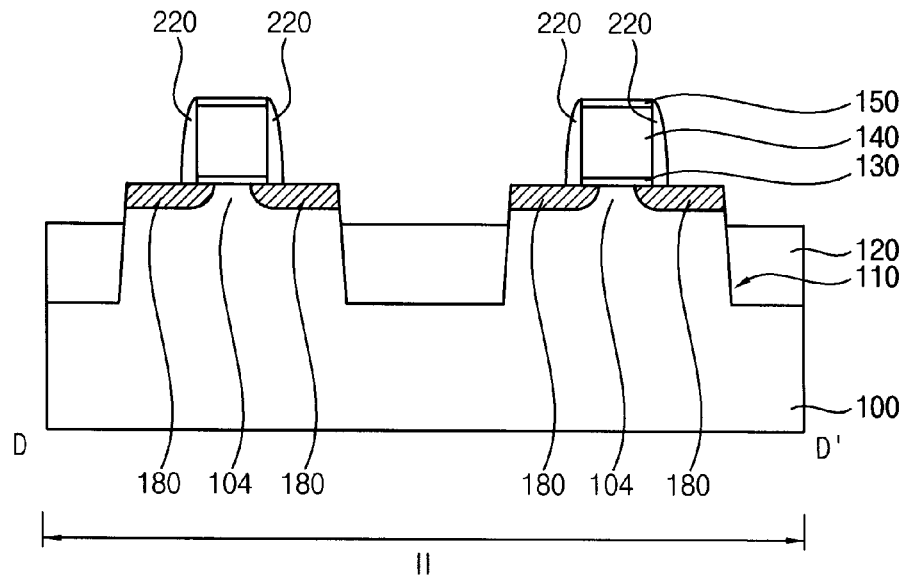

1ST DIRECTION
⊗——— 2ND DIRECTION

2ND DIRECTION
⊗ ← 1ST DIRECTION

2ND DIRECTION
⊗ ← 1ST DIRECTION

1ST DIRECTION
⊗ ⟶ 2ND DIRECTION

1ST DIRECTION
⊗ ⟶ 2ND DIRECTION

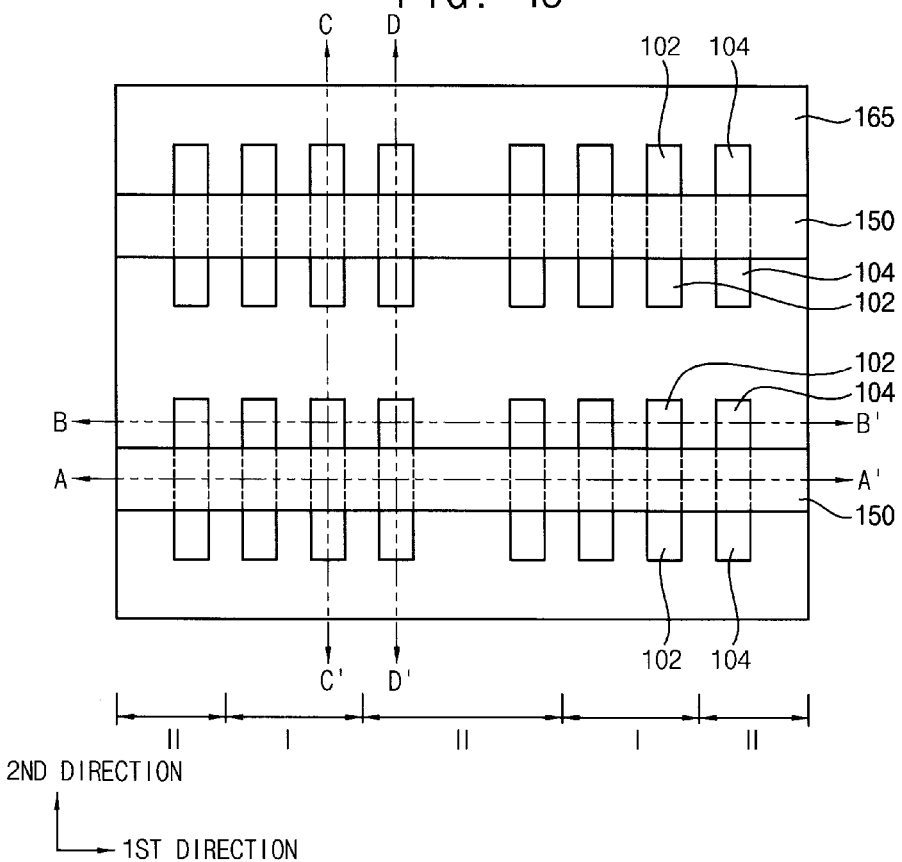
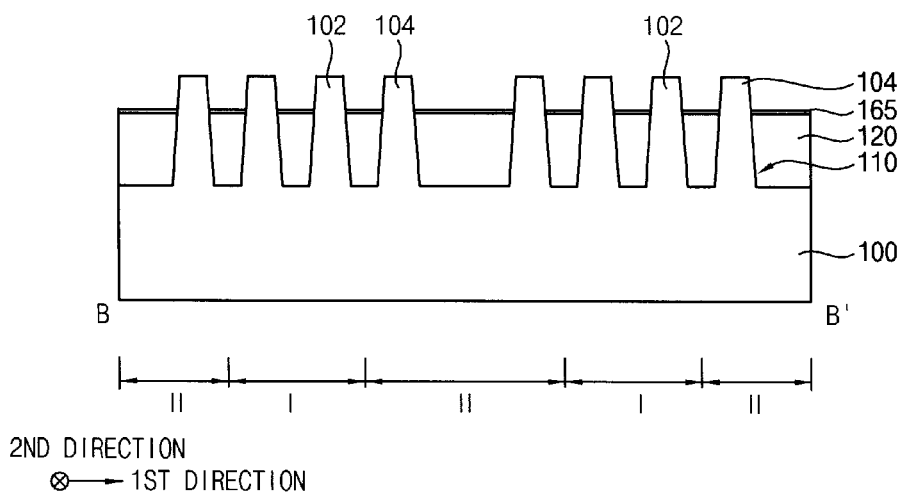

2ND DIRECTION
⊗——1ST DIRECTION

1ST DIRECTION
⊗——2ND DIRECTION

2ND DIRECTION
⊗→ 1ST DIRECTION

1ST DIRECTION
⊗→ 2ND DIRECTION

METHODS OF MANUFACTURING SEMICONDUCTOR DEVICES AND ELECTRONIC DEVICES

CROSS-REFERENCE TO RELATED APPLICATION

This application claims priority under 35 USC §119 to Korean Patent Application No. 10-2013-0165828, filed on Dec. 27, 2013 in the Korean Intellectual Property Office (KIPO), the contents of which are herein incorporated by reference in their entirety.

BACKGROUND

1. Field

Example embodiments relate to methods of manufacturing semiconductor devices and electronic devices. More particularly, example embodiments relate to methods of manufacturing semiconductor devices and electronic devices including an impurity region.

2. Description of the Related Art

When impurities are implanted into a substrate, a photoresist pattern may be formed as an ion implantation mask. The photoresist pattern may be formed by depositing a photoresist layer on the substrate and patterning the photoresist layer. As sizes of devices are reduced, an undercut may occur in the photoresist pattern due to diffuse reflection in patterning the photoresist layer, and ions may be implanted into undesired portions of the substrate to form an impurity region in a subsequent process, which may deteriorate the characteristics of the devices.

SUMMARY

Example embodiments provide a method of manufacturing a semiconductor device having good characteristics.

Example embodiments provide a method of manufacturing an electronic device having good characteristics.

According to example embodiments, there is provided a method of manufacturing a semiconductor device. In the method, an isolation layer pattern is formed on a substrate to define a field region covered by the isolation layer pattern and a first and a second active regions that is not covered by the isolation layer pattern and protrudes from the isolation layer pattern. A first anti-reflective layer is formed on the isolation layer pattern. A first photoresist layer is formed on the first and second active regions of the substrate and the first anti-reflective layer. The first photoresist layer is partially etched to form a first photoresist pattern covering the first active region. Impurities are implanted into the second active region to form a first impurity region, wherein the first anti-reflective layer is formed by a gap-fill process.

In example embodiments, the first photoresist pattern may be formed to cover a portion of the first anti-reflective layer adjacent to the first active region.

In example embodiments, the first photoresist pattern and the first anti-reflective layer may be removed.

In example embodiments, a second anti-reflective layer may be formed on the isolation layer pattern. A second photoresist layer may be formed on the first and second active regions of the substrate and the second anti-reflective layer. The second photoresist layer may be partially etched to form a second photoresist pattern covering the second active region. Impurities may be implanted into the first active region to form a second impurity region.

In example embodiments, the first and second impurity regions may be formed to include impurities having different conductivity from each other.

In example embodiments, when the first photoresist pattern and the first anti-reflective layer are removed, an ashing process and/or a stripping process may be performed.

In example embodiments, prior to forming the first anti-reflective layer, a first gate structure may be formed on the first and second active regions. The first impurity region may be formed at an upper portion of the second active region adjacent to the first gate structure.

In example embodiments, a gate insulation layer pattern and a dummy gate electrode sequentially stacked on the first and second active regions may be formed.

In example embodiments, after forming the first impurity region, a spacer may be formed on a sidewall of the first gate structure. An insulating interlayer surrounding the first gate structure and the spacer may be formed. The dummy gate electrode may be removed to form an opening exposing the gate insulation layer pattern. A high-k dielectric layer pattern may be formed on the exposed gate insulation layer pattern and a sidewall of the opening. A gate electrode filling a remaining portion of the opening may be formed to form a second gate structure including the gate insulation layer pattern, the high-k dielectric layer pattern and the gate electrode sequentially stacked.

In example embodiments, after forming the first impurity region, a spacer may be formed on a sidewall of the gate structure. An upper portion of the second active region not covered by the first gate structure and the spacer may be removed to form a trench. A source/drain layer may be formed on the trench. An elevated source drain (ESD) layer may be formed on the sour/drain layer.

In example embodiments, when the first photoresist layer is partially removed, an exposure process and a developing process may be performed on the first photoresist layer.

In example embodiments, the exposure process may be performed using KrF, ArF, extreme ultra violet (EUV), vacuum ultra violet (VUV), electron beam, X-ray, or ion beam.

According to example embodiments, there is provided a method of manufacturing a semiconductor device. In the method, an anti-reflective layer is formed on a substrate and an isolation layer pattern. The substrate includes a field region covered by the isolation layer pattern and a plurality of active regions protruding from the isolation layer pattern. A photoresist layer is formed on the anti-reflective layer. The photoresist layer is partially etched to form a photoresist pattern covering a portion of the active regions. Impurities are implanted through the anti-reflective layer into the active regions not covered by the photoresist pattern to form an impurity region.

In example embodiments, the photoresist pattern may cover a portion of the anti-reflective layer adjacent to the active regions.

In example embodiments, prior to forming the anti-reflective layer, a dummy gate structure including a gate insulation layer pattern and a dummy gate electrode sequentially stacked on the active regions may be formed. The impurity region may be formed at an upper portion of the active region adjacent to the dummy gate structure.

According to example embodiments, an anti-reflective layer having a thin thickness may be formed on a substrate having an active fin or an isolation layer pattern so that conditions for an ion implantation process may not be changed even without etching the anti-reflective layer. Thus, the anti-reflective layer may not be etched in the ion implantation process so as not to damage the active fin under the anti-reflective layer.

According to some other embodiments, a method of manufacturing an electronic device comprises forming an isolation layer pattern on a substrate, forming gate structures on a first active region surrounded by the isolation layer pattern and on a second active region surrounded by the isolation layer pattern, forming an anti-reflective layer on the substrate, forming a photoresist layer on the anti-reflective layer, removing a portion of the photoresist layer formed on a portion of the first active region to form a photoresist pattern covering the second active region, and implanting impurities into the first active region, wherein the anti-reflective layer has a thickness about 150 Å or less.

The method may further comprise exposing the photoresist layer to a light through a mask pattern, wherein the light is extreme ultraviolet light, vacuum ultraviolet light, KrF, ArF, ion beam, electron beam or X-ray. The anti-reflective layer may cover the first active region during the step of implanting impurities into the first active region. The anti-reflective layer may be formed by a gap-fill process. The photoresist pattern may block the impurities during the step of implanting impurities into the first active region.

BRIEF DESCRIPTION OF THE DRAWINGS

Example embodiments will be more clearly understood from the following detailed description taken in conjunction with the accompanying drawings.

FIGS. 1 to 48 are plan views and cross-sectional views illustrating stages of a method of manufacturing a semiconductor device in accordance with example embodiments; and FIGS. 49 to 59 are plan views and cross-sectional views illustrating stages of a method of manufacturing a semiconductor device in accordance with example embodiments.

DESCRIPTION OF EMBODIMENTS

Figure 1:
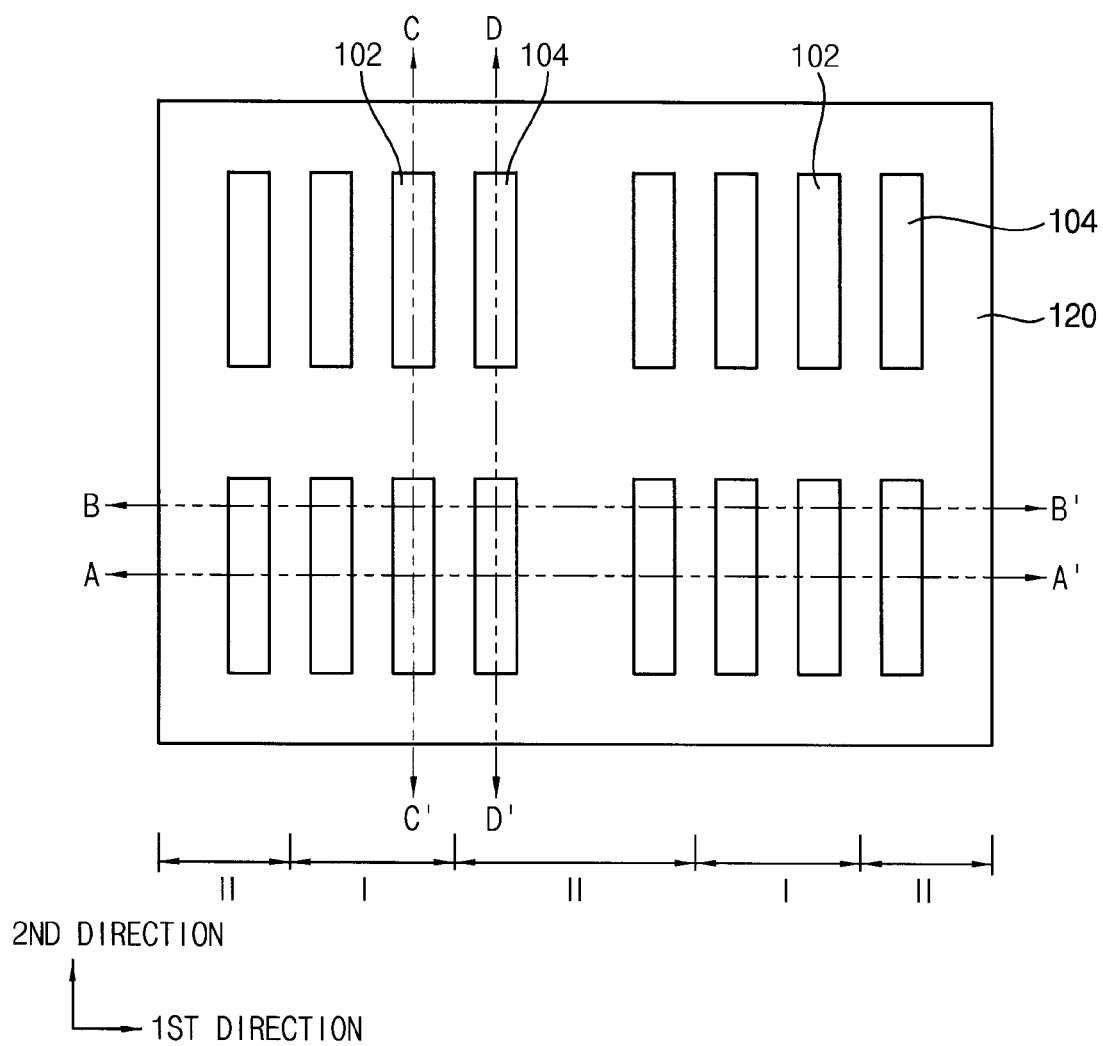
FIGS. 1 to 59 represent example embodiments as described herein. However, the scope of this disclosure is not limited to the features illustrated in the FIGS. 1 to 59.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). Variations from the shapes of the illustrations are to be expected as a result, for example, of manufacturing techniques and/or tolerances. Thus, example embodiments should not be construed as limited to the particular shapes of regions illustrated herein. Exemplary embodiments should be construed to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this technology belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 48 are plan views and cross-sectional views illustrating stages of a method of manufacturing a semiconductor device in accordance with example embodiments. Particularly, FIGS. 1, 4, 8, 12, 16, 20, 24, 28, 33, 37, 41 and 44 are plan views illustrating stages of the method of manufacturing the semiconductor device, and FIGS. 2-3, 5-7, 9-11, 13-15, 17-19, 21-23, 25-27, 29-32, 34-36, 38-40, 42-43 and 45-48 are cross-sectional views illustrating stages of the method of manufacturing the semiconductor device.

FIGS. 2, 5, 9, 13, 17, 21, 25, 29, 42 and 45 are cross-sectional views cut along a line A-A' of the corresponding plan views, FIGS. 6, 10, 14, 18, 22, 26, 30, 34, 38 and 46 are cross-sectional views cut along a line B-B' of the corresponding plan views, FIGS. 3, 7, 11, 15, 27, 31, 35, 39, 43 and 47 are cross-sectional views cut along a line C-C' of the corresponding plan views, and FIGS. 19, 23, 32, 36, 40 and 48 are cross-sectional views cut along a line D-D' of the corresponding plan views.

Figure 2A:
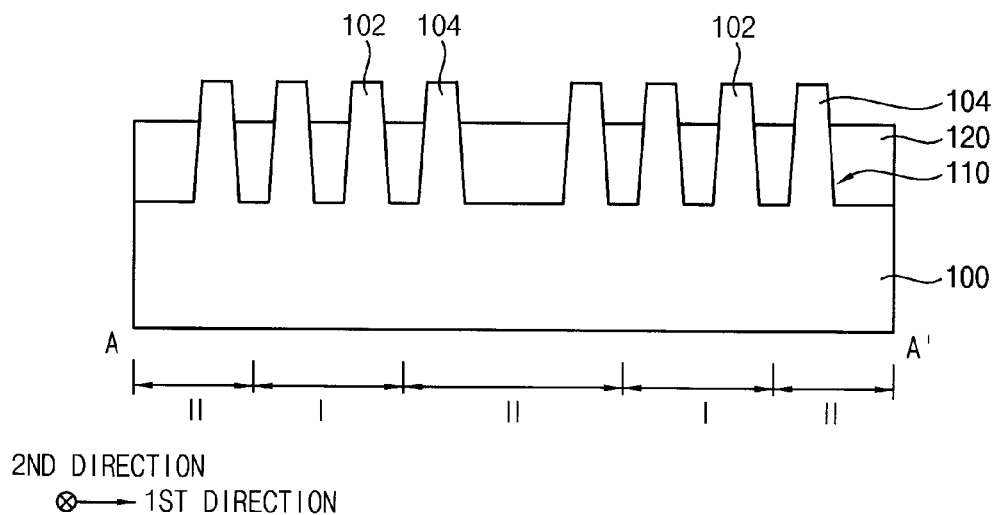
Figure 3:
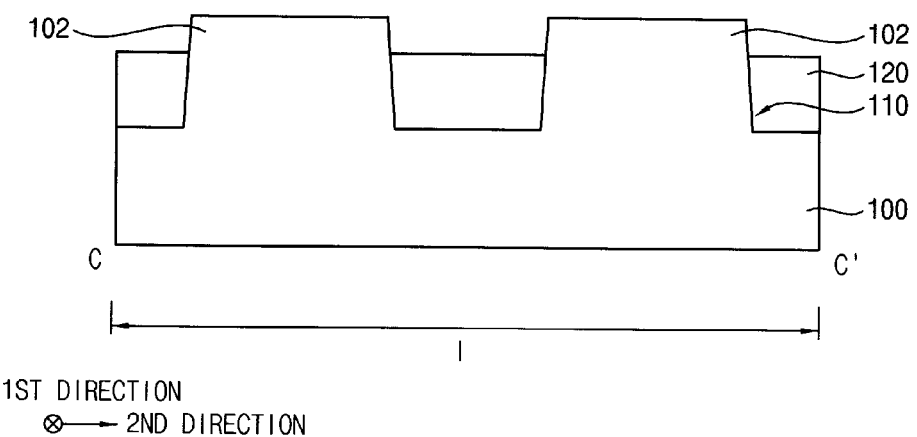
Figure 4:
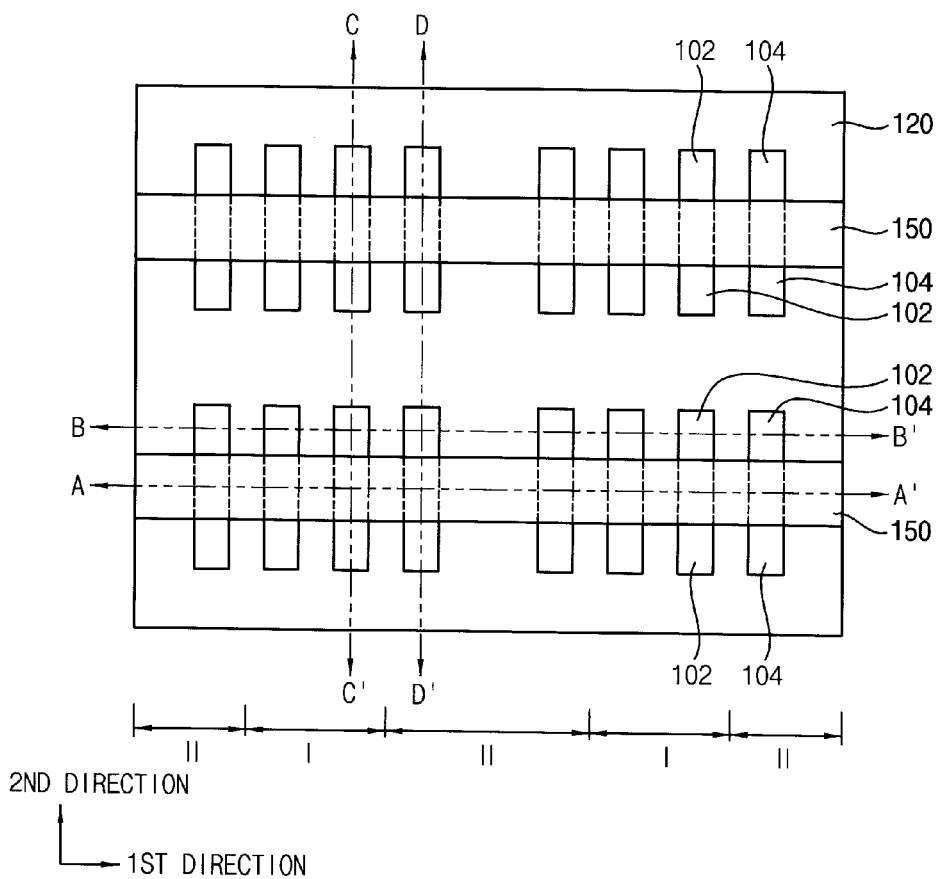
Figure 5:
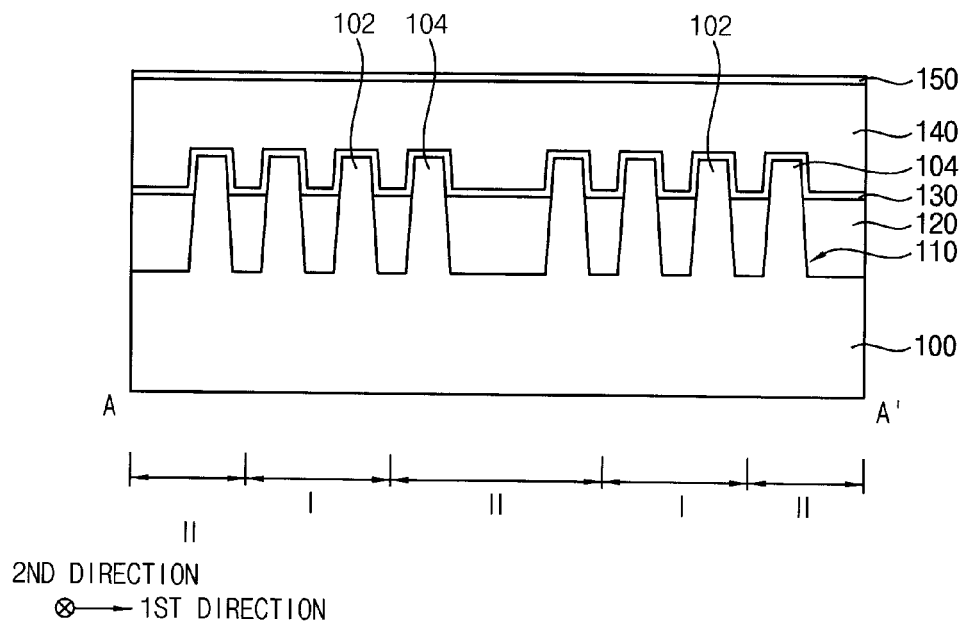
Figure 6:
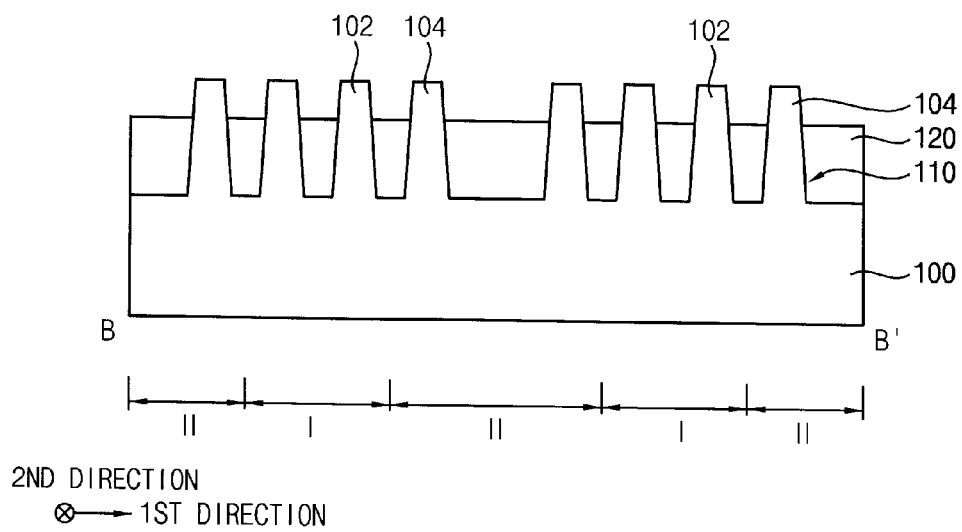
Figure 7:
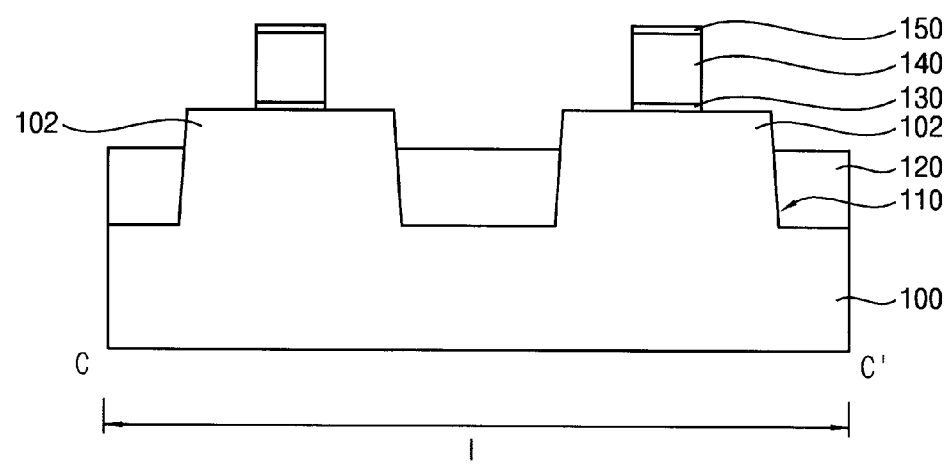
Figure 8:
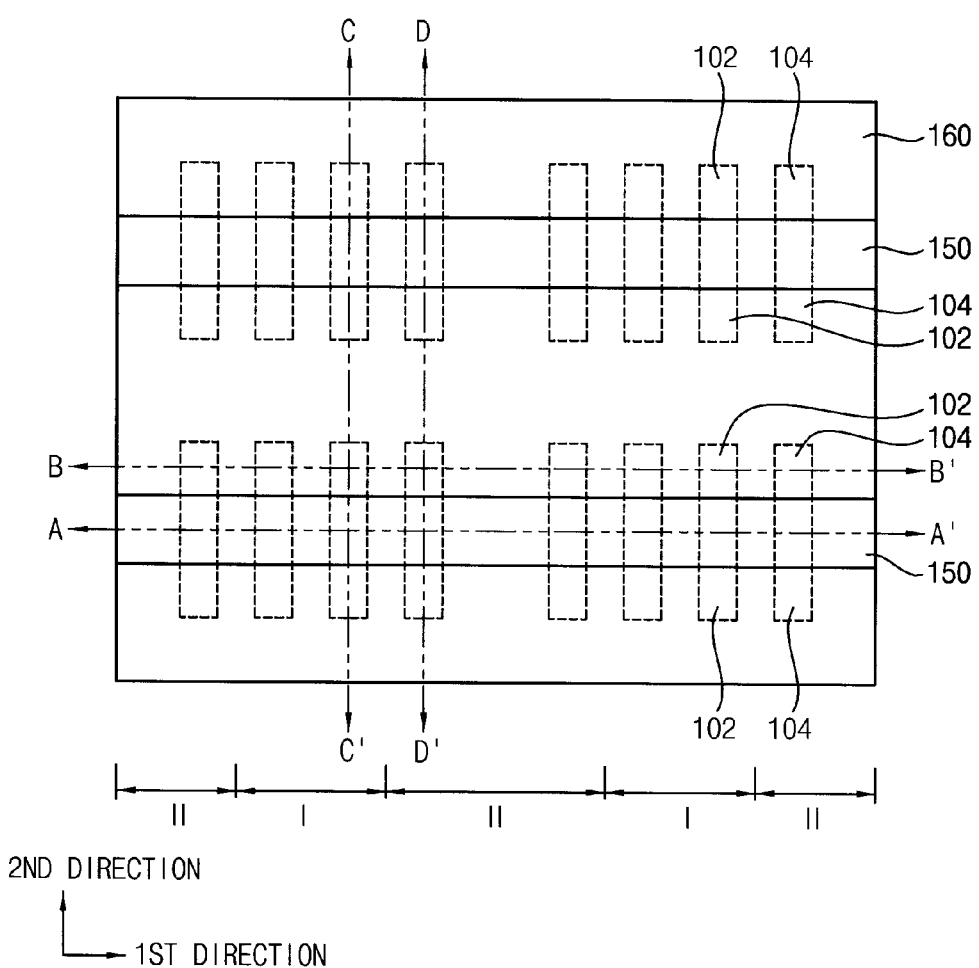
Figure 9:
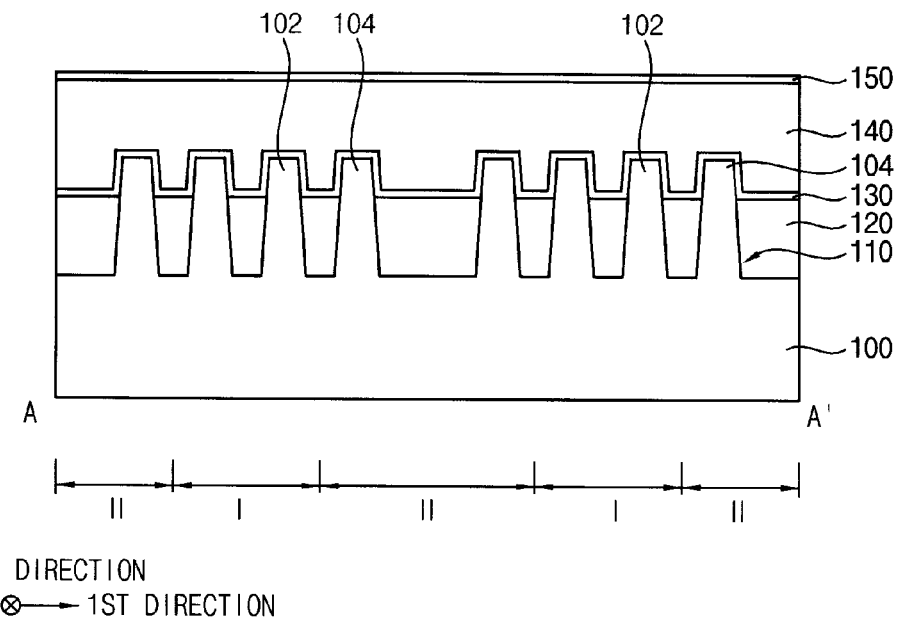
Figure 10:
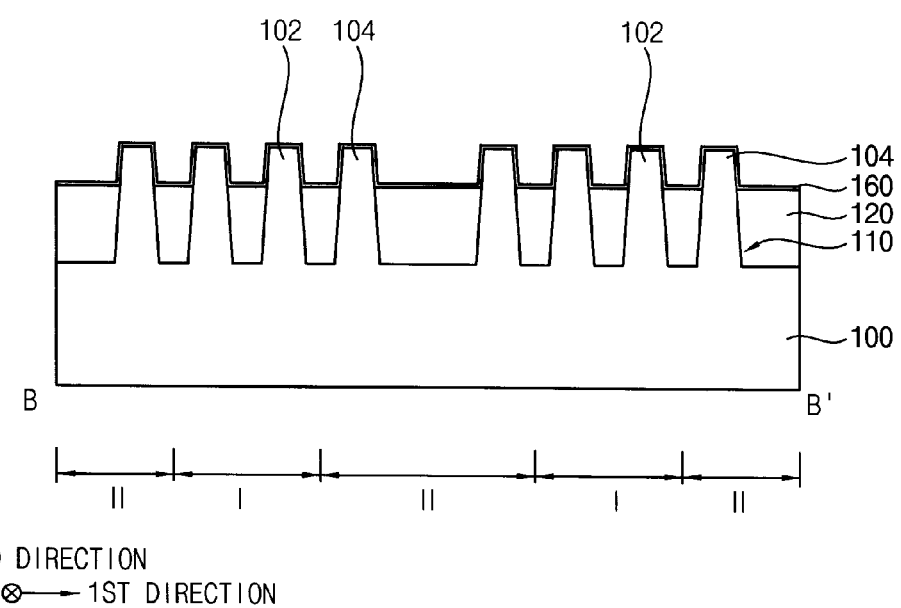
Figure 11:
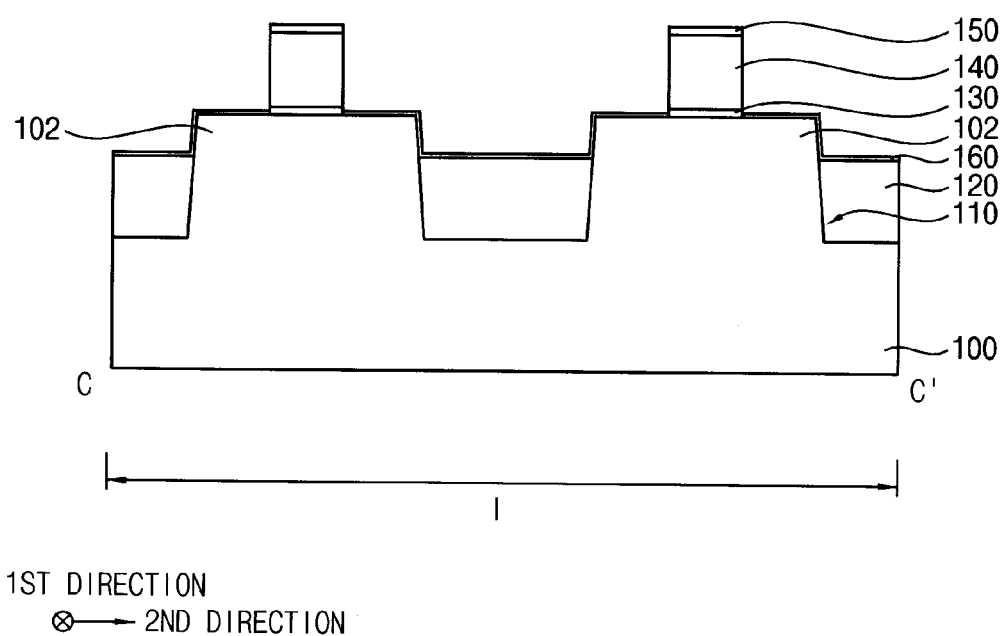
Figure 12:
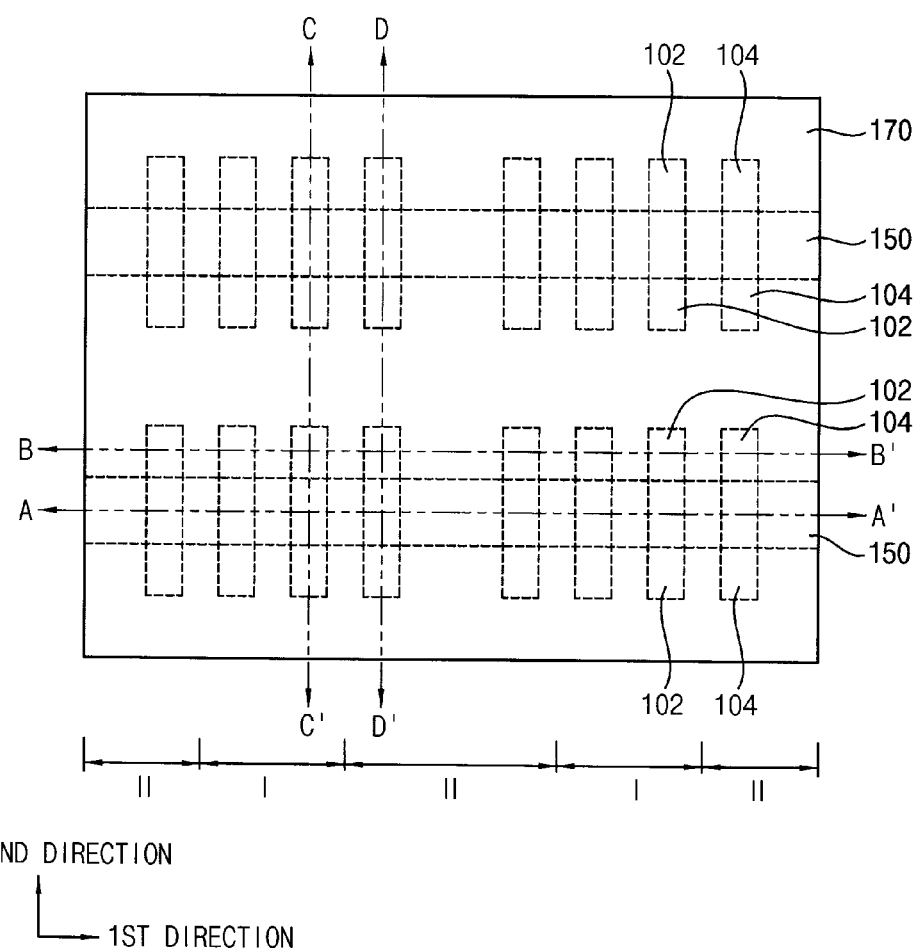
Figure 13:
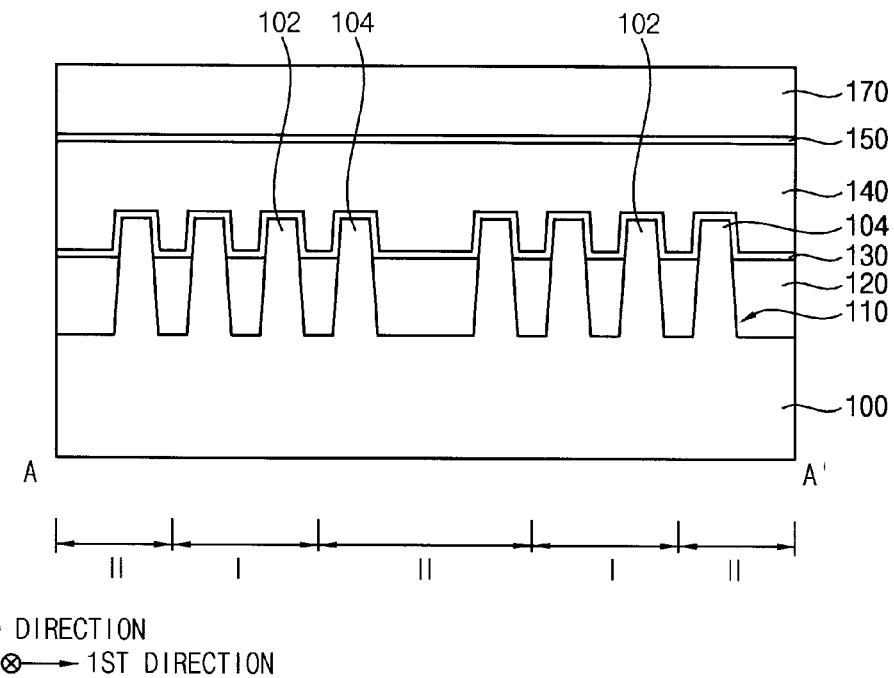
Figure 14:
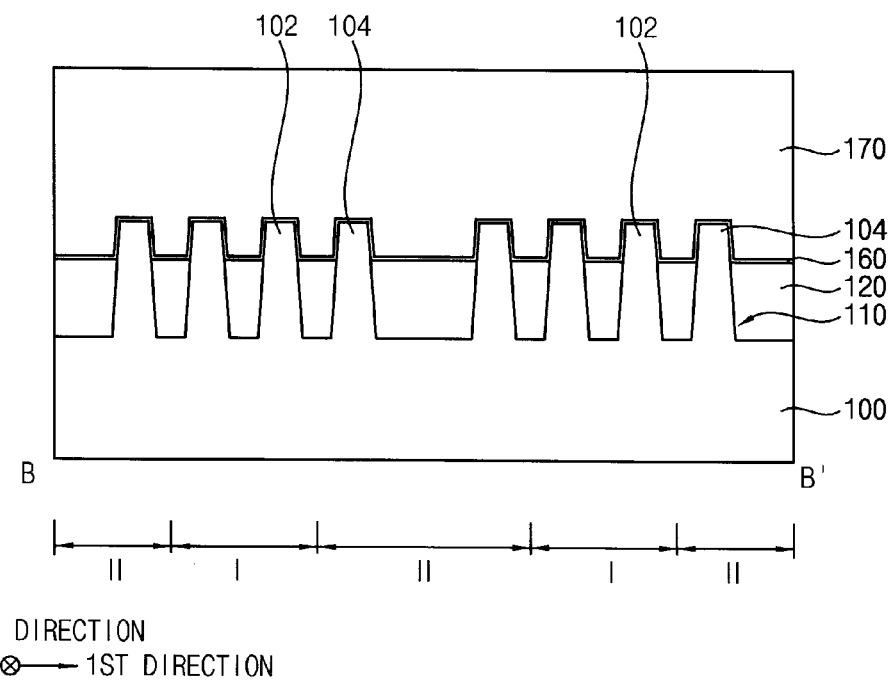
Figure 15:
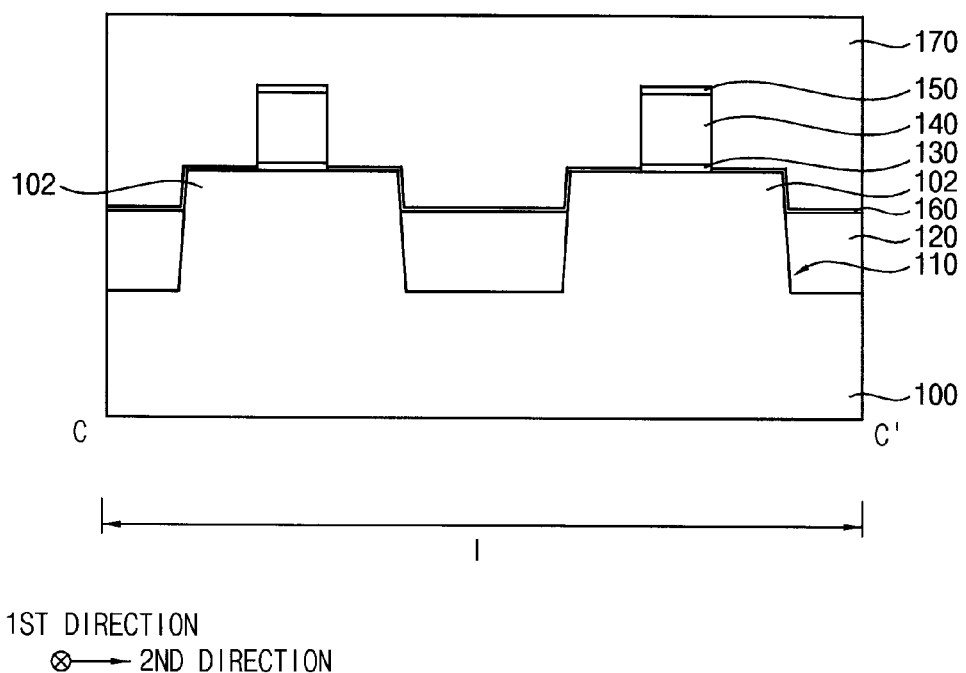
Figure 16:
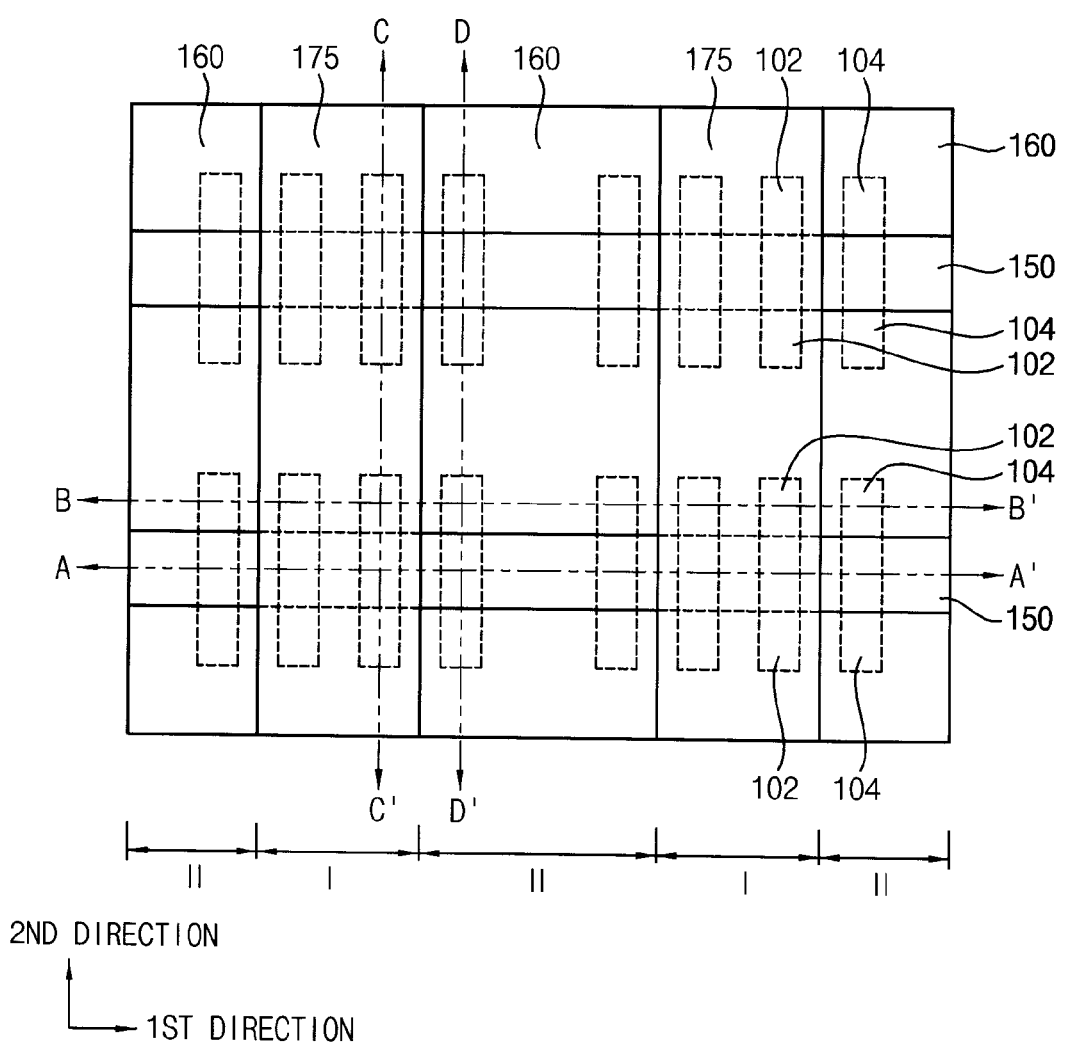
Figure 19:
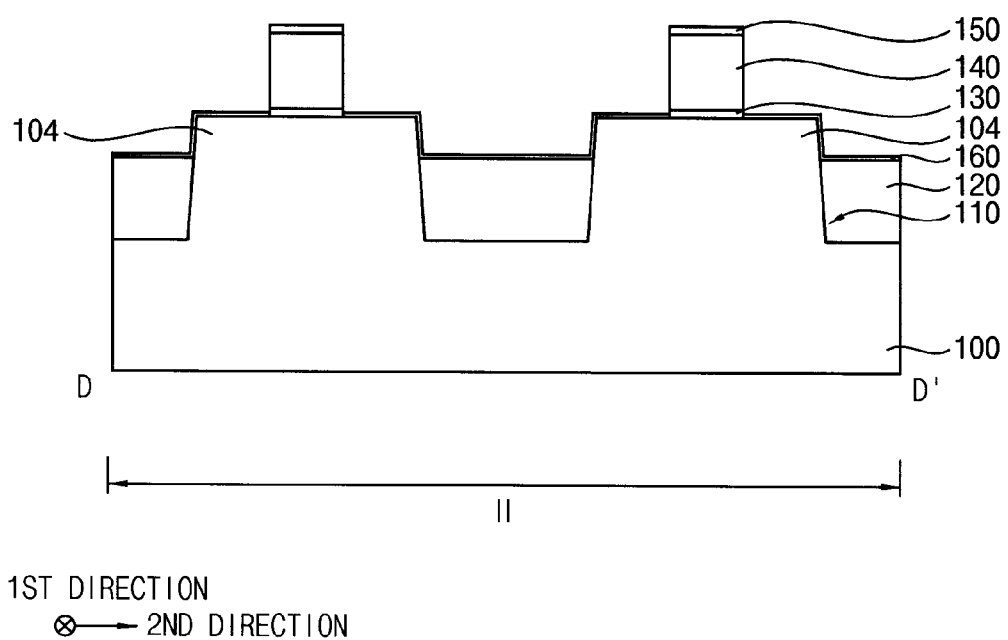
Figure 20:
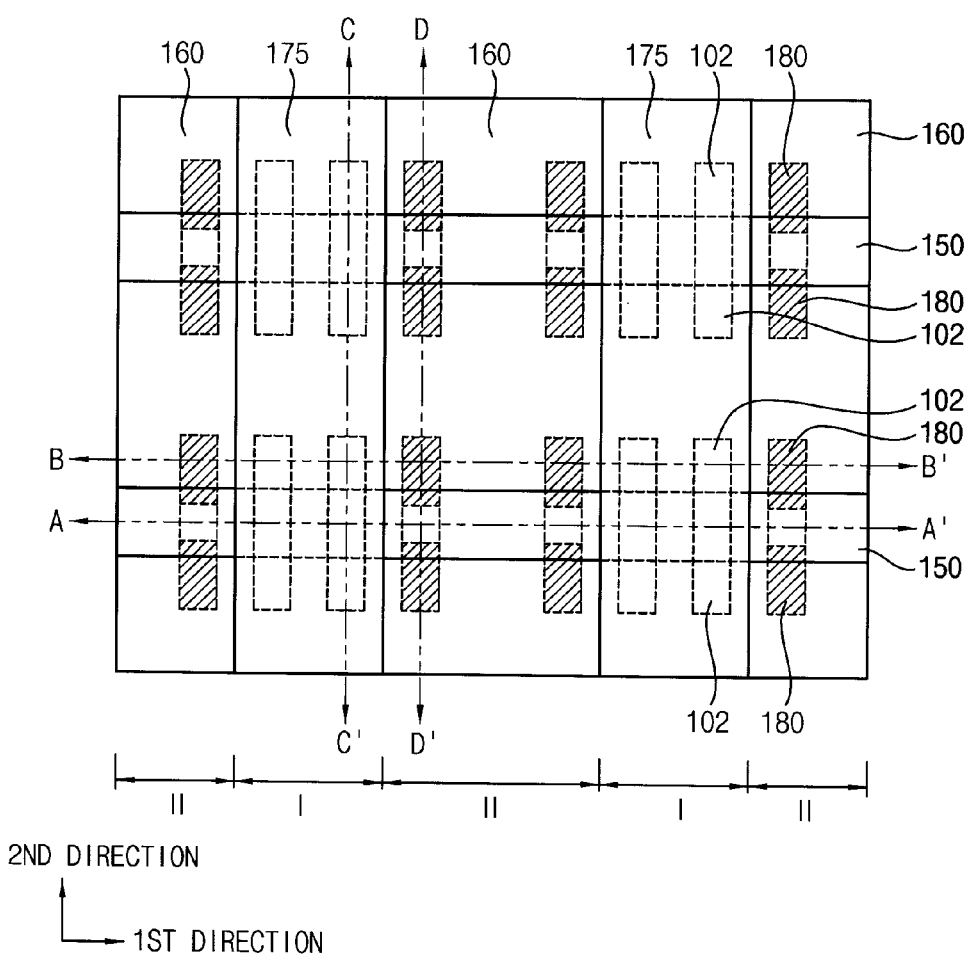
Figure 21:
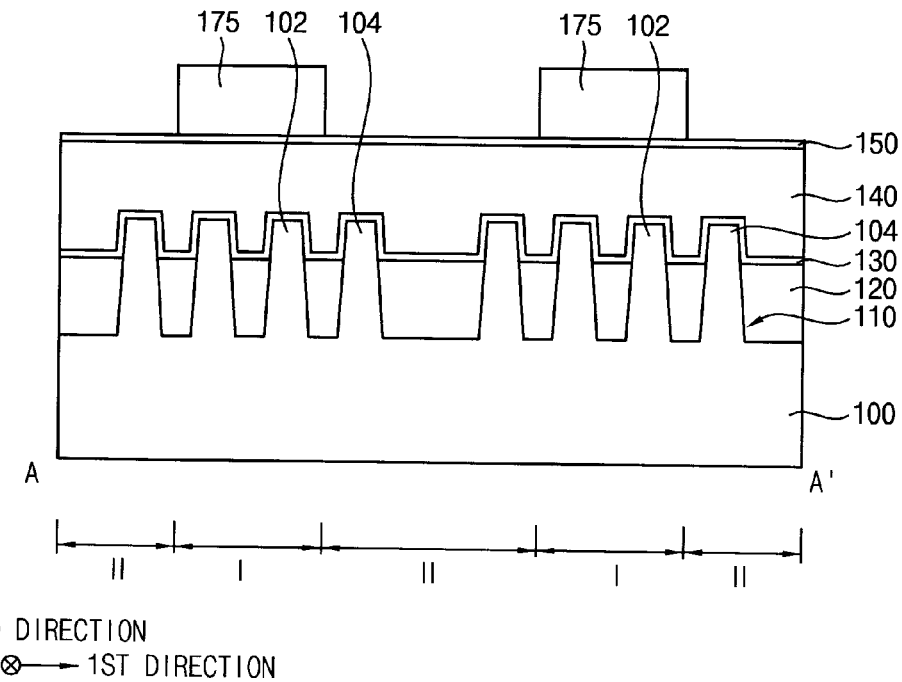
Figure 22:
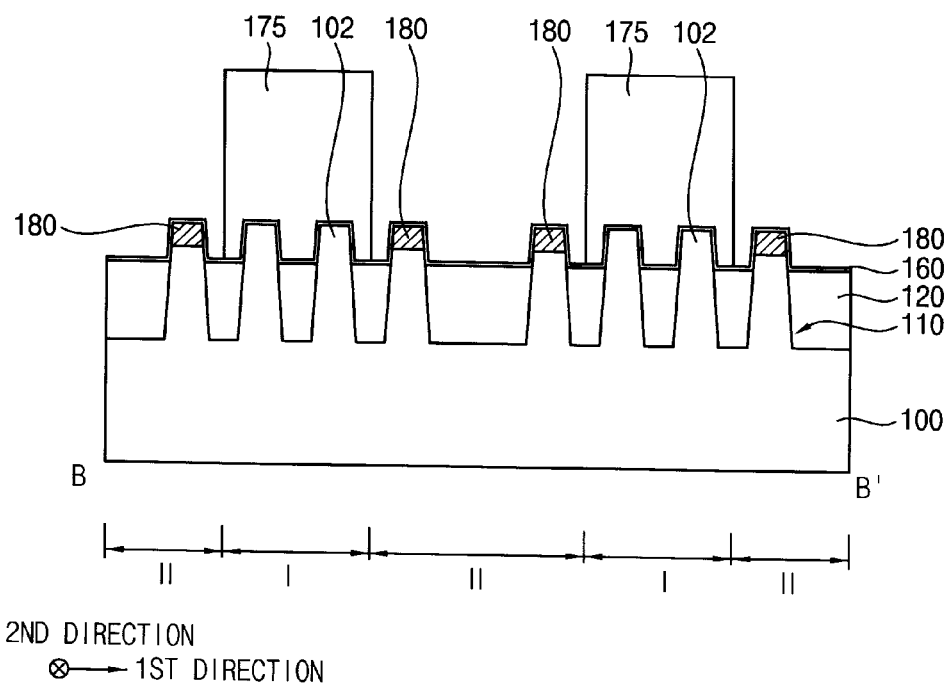
Figure 23:
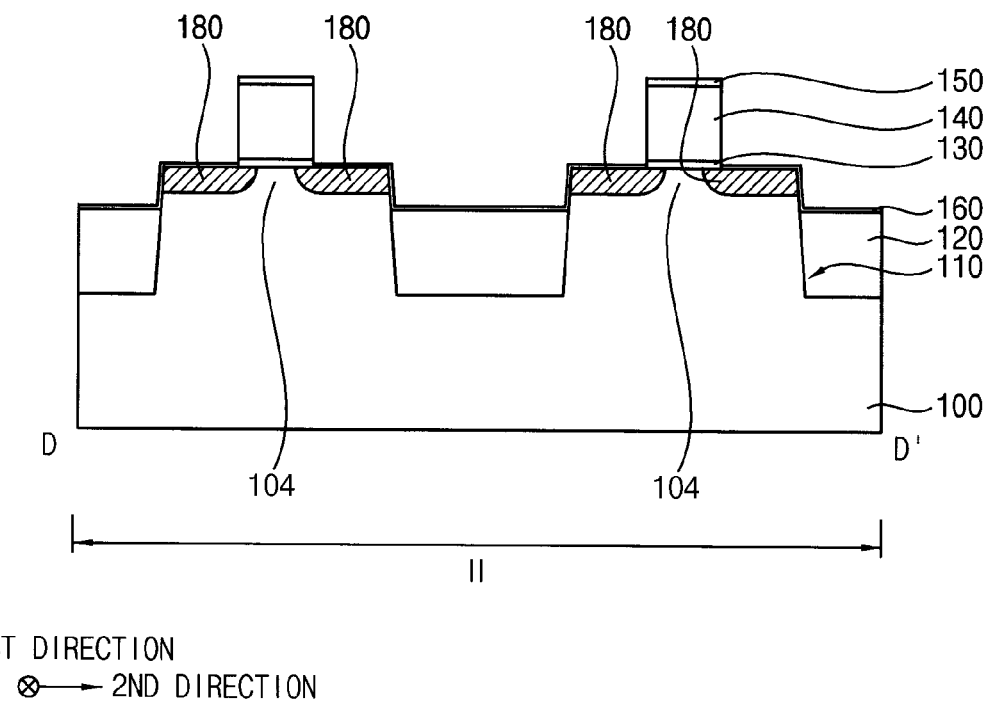
Figure 24:
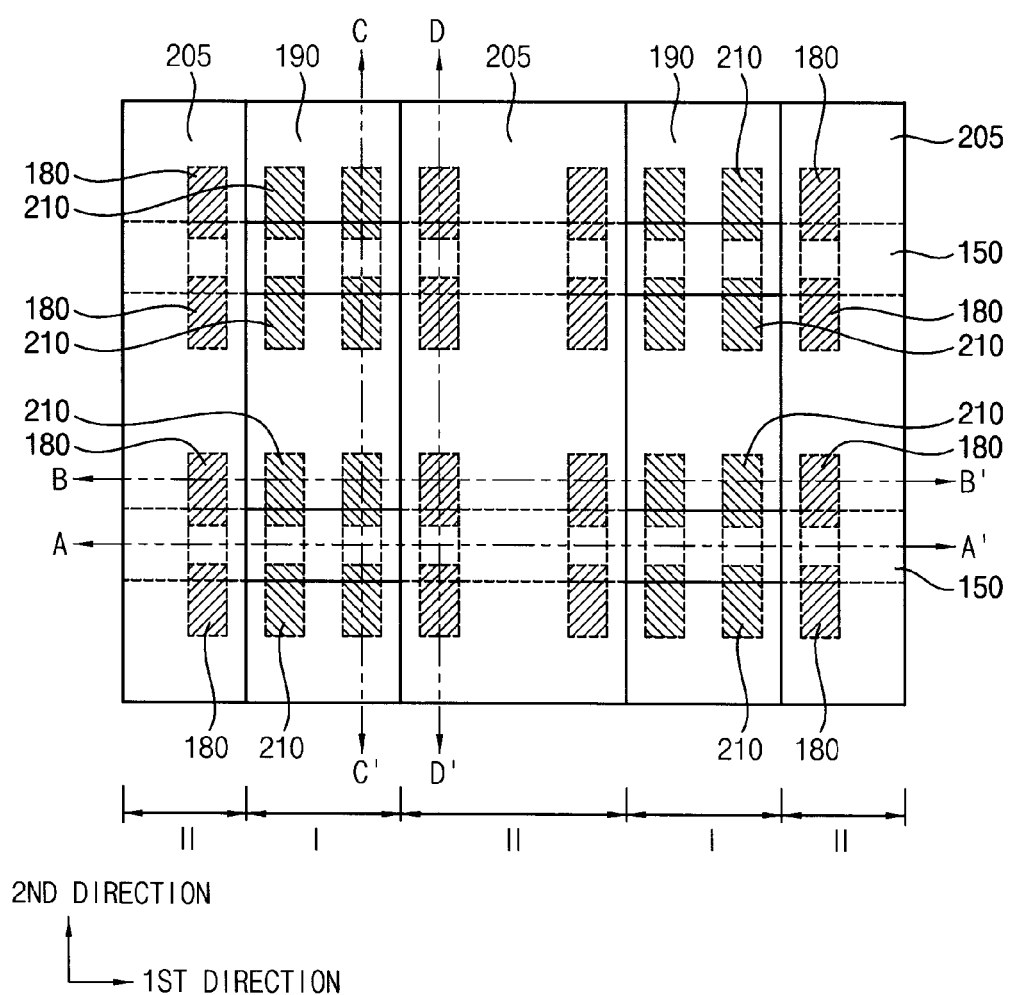
Figure 25:
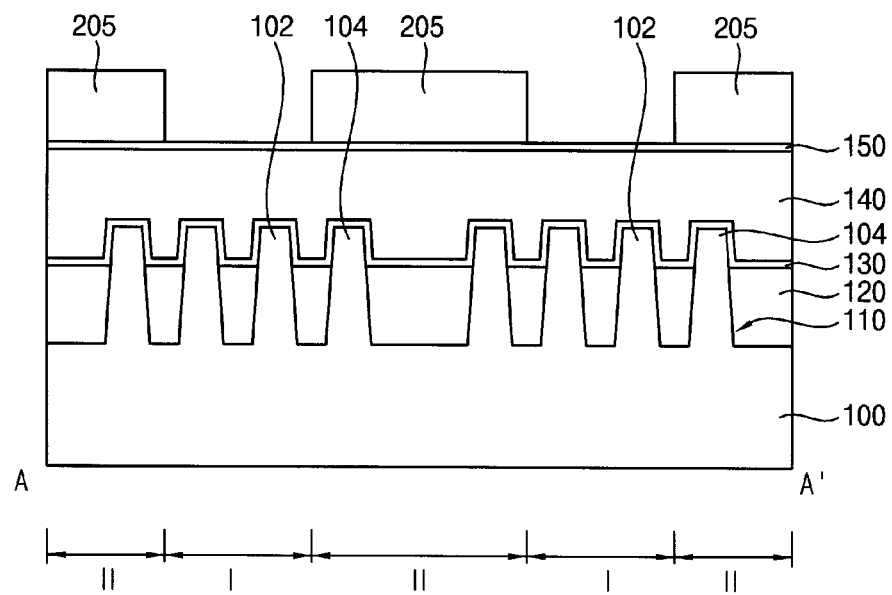
Figure 26:
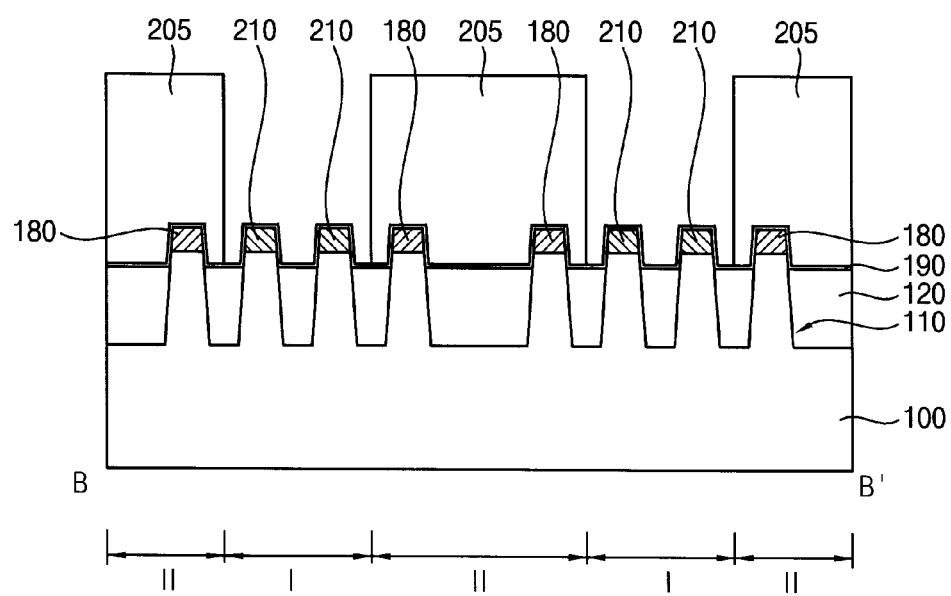
Figure 27:
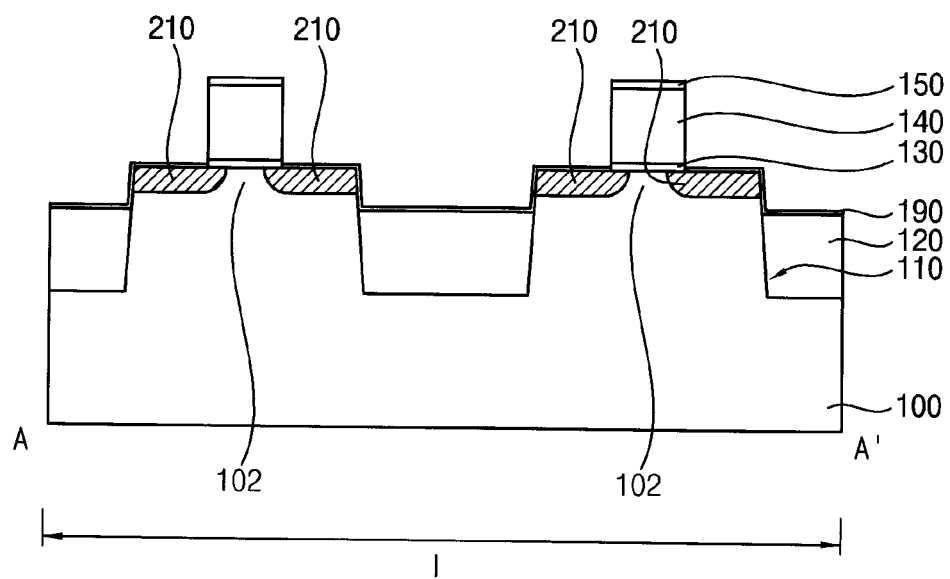
Figure 28:
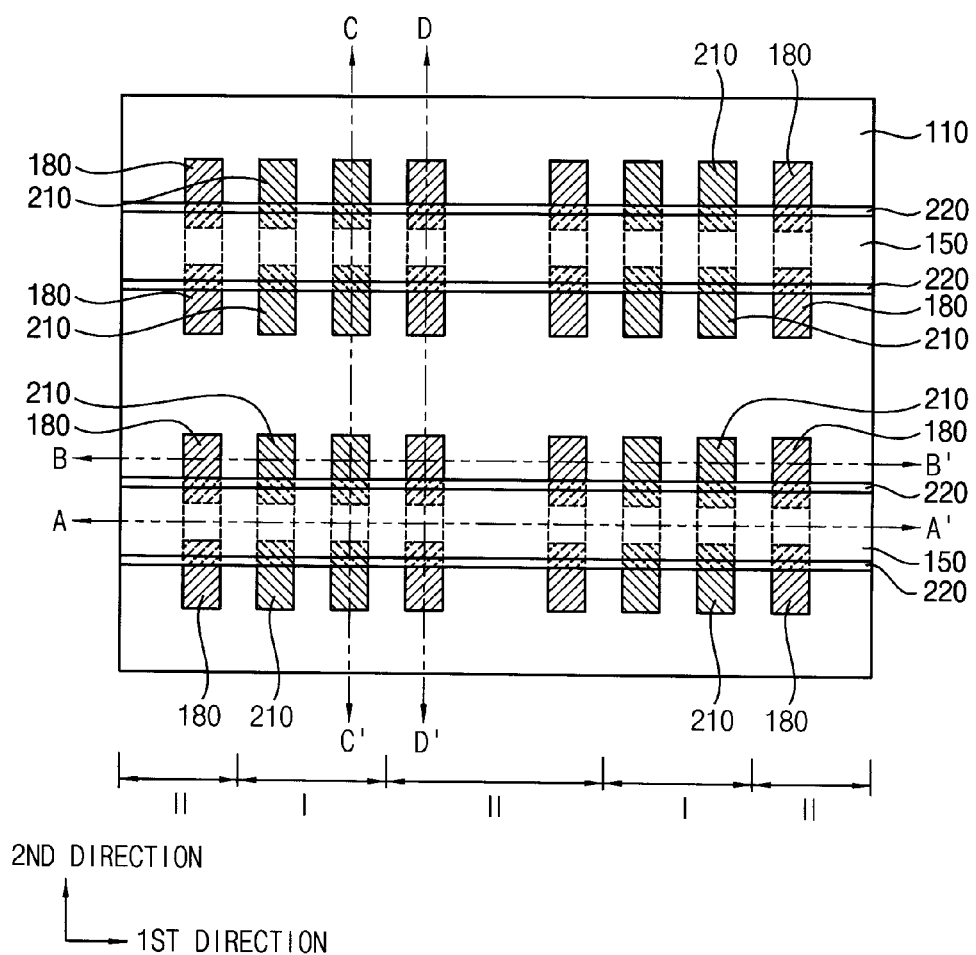
Figure 29:
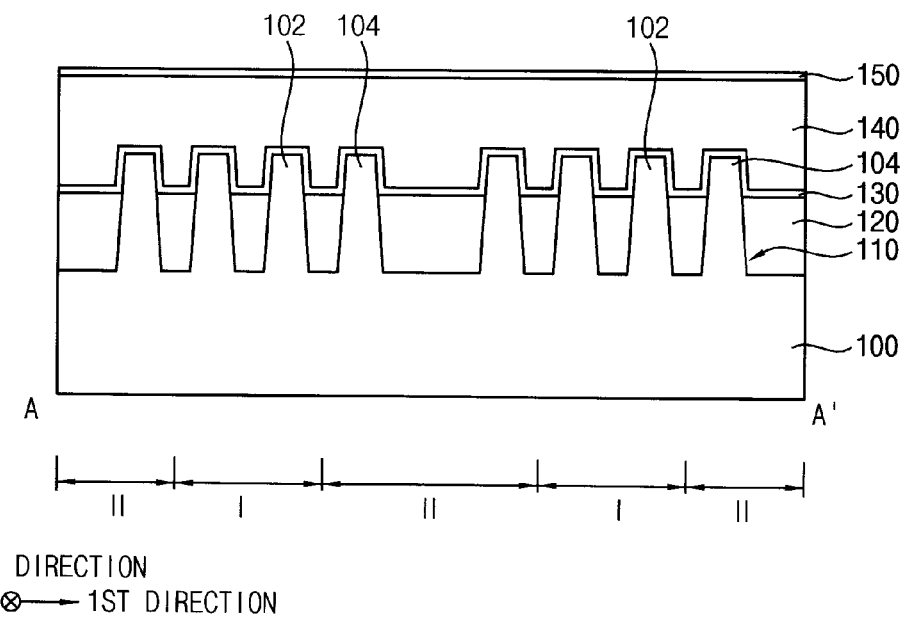
Figure 30:
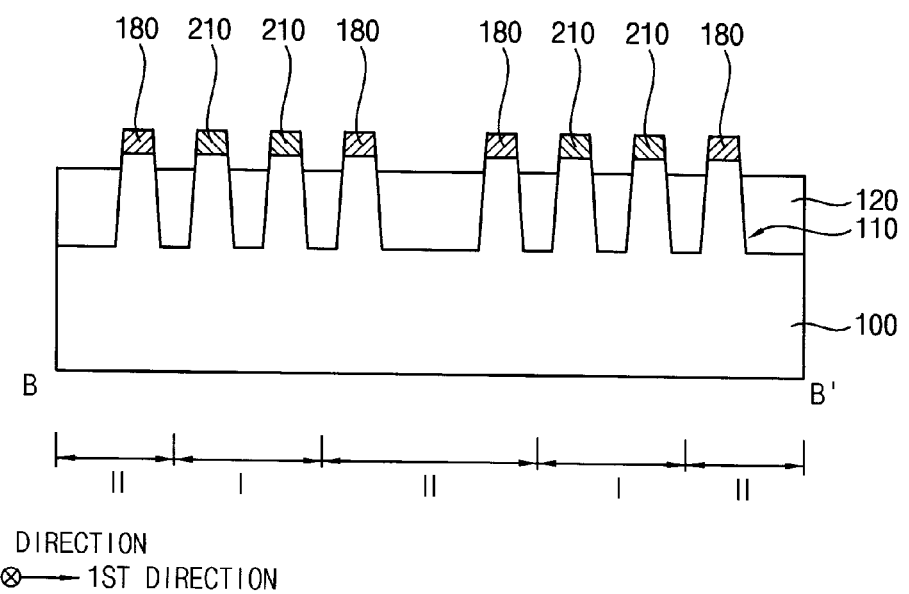
Figure 33:
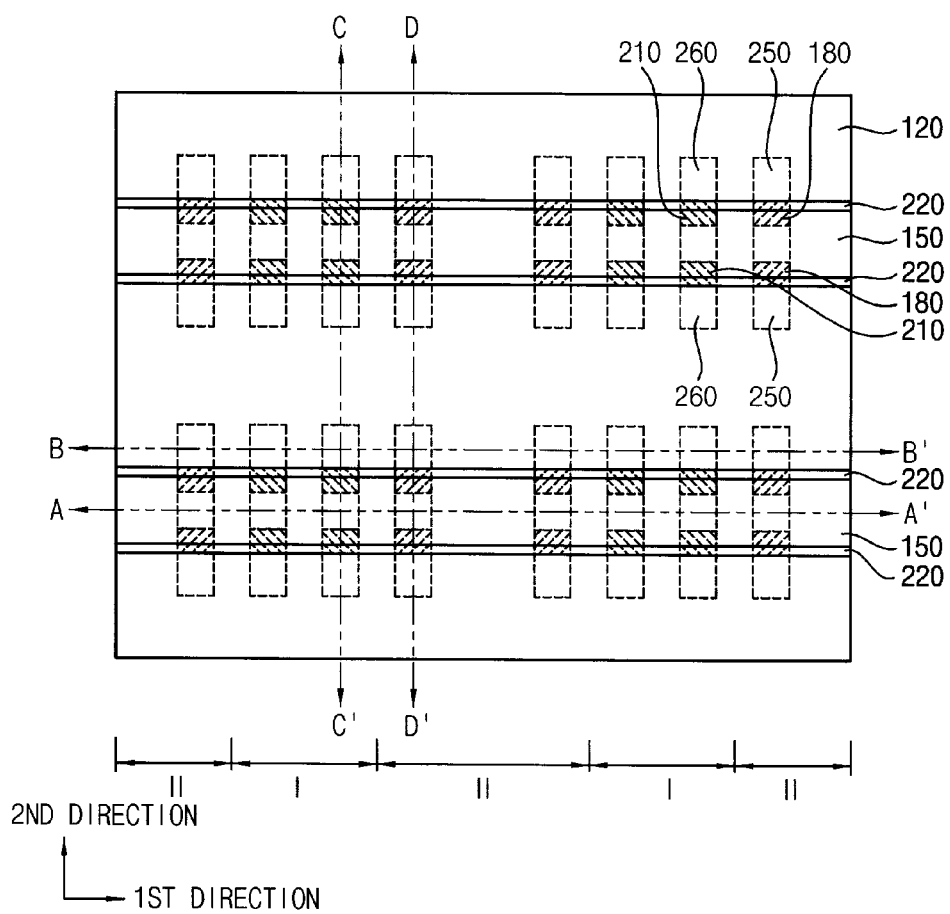
Figure 34:
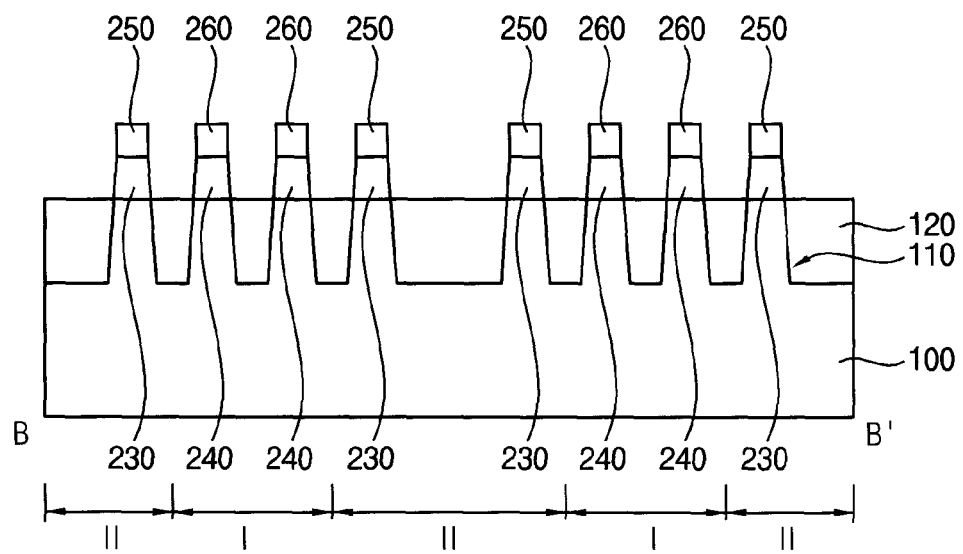
Figure 35:
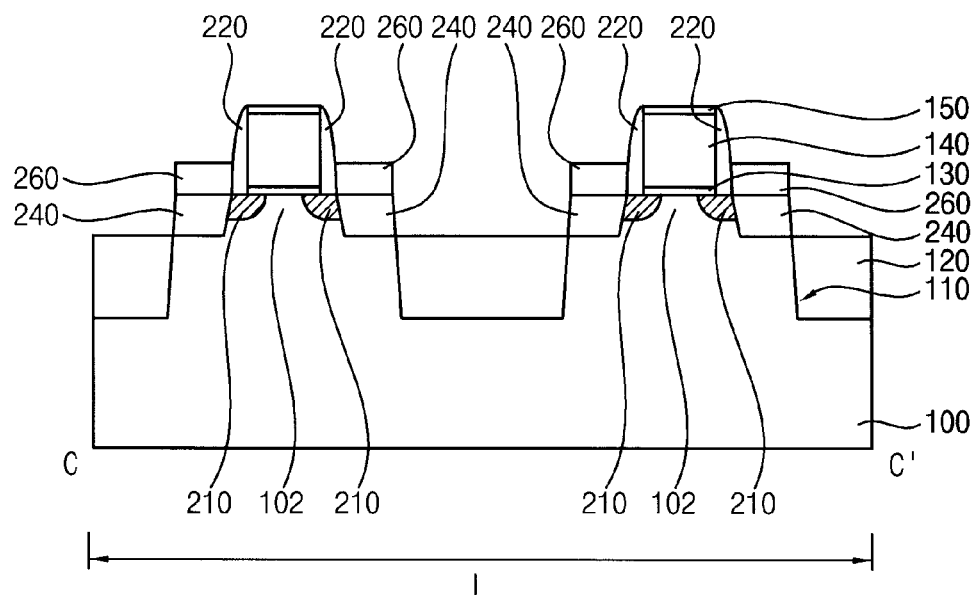
Figure 36:
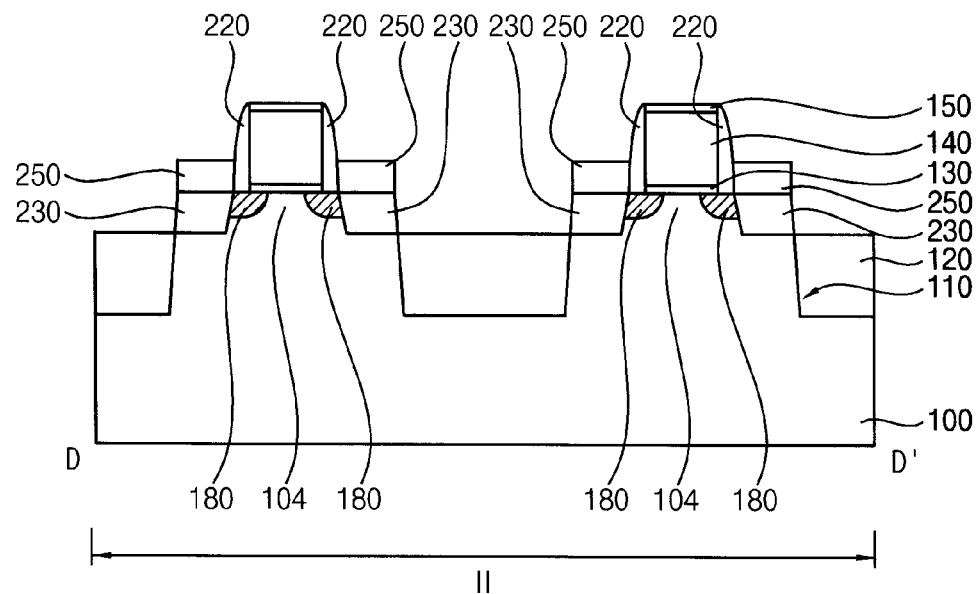
Figure 37:
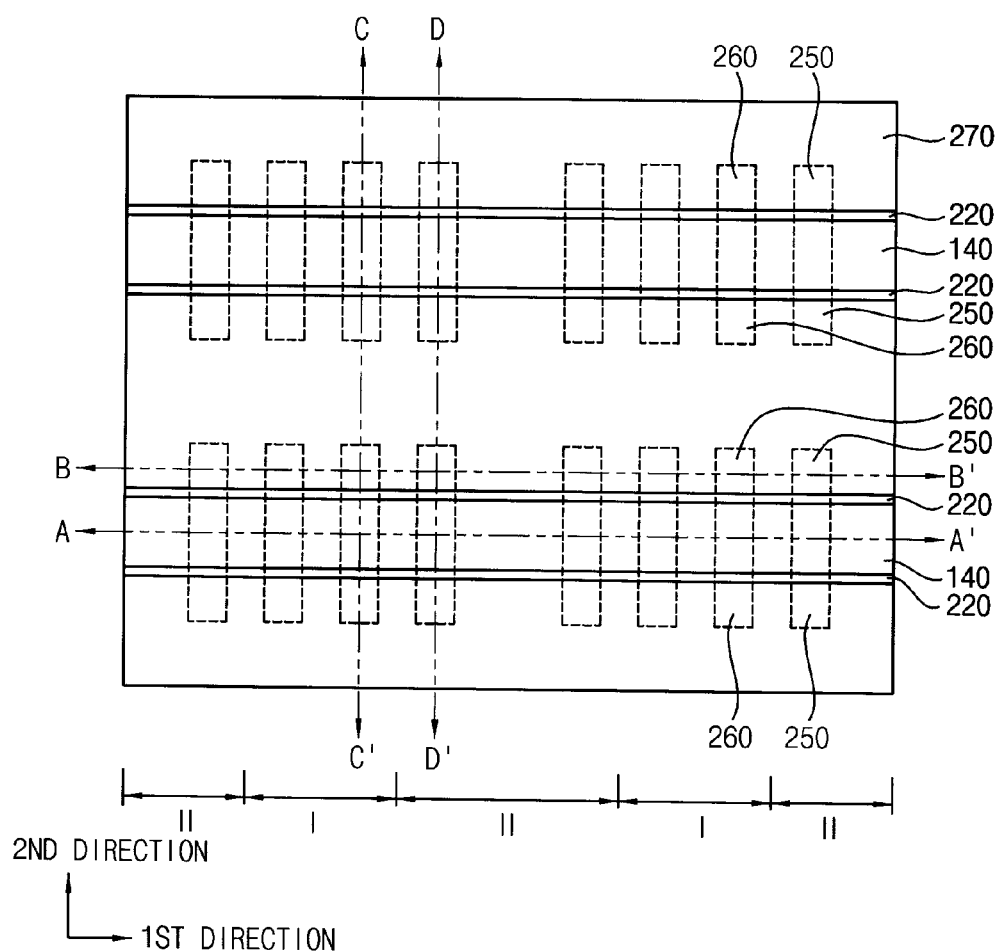
Figure 38:
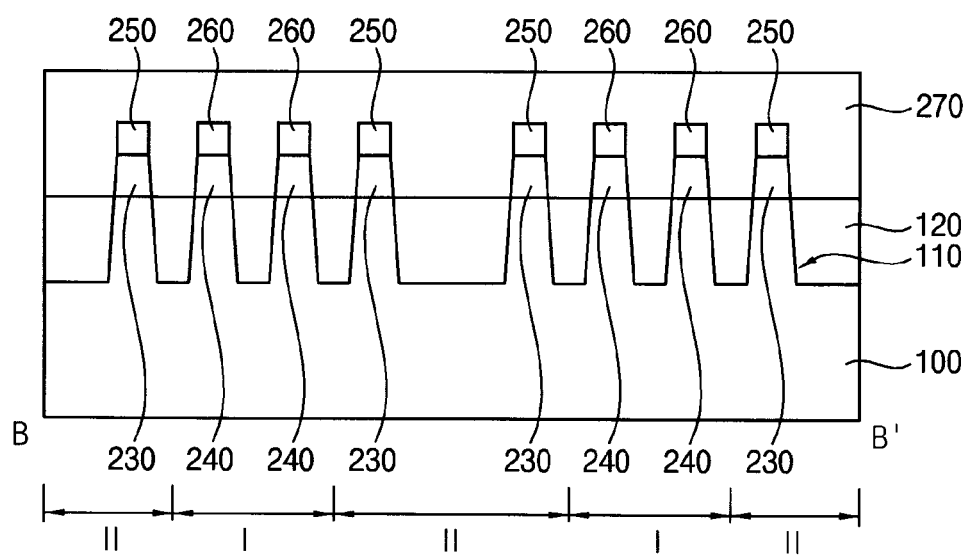
Figure 39:
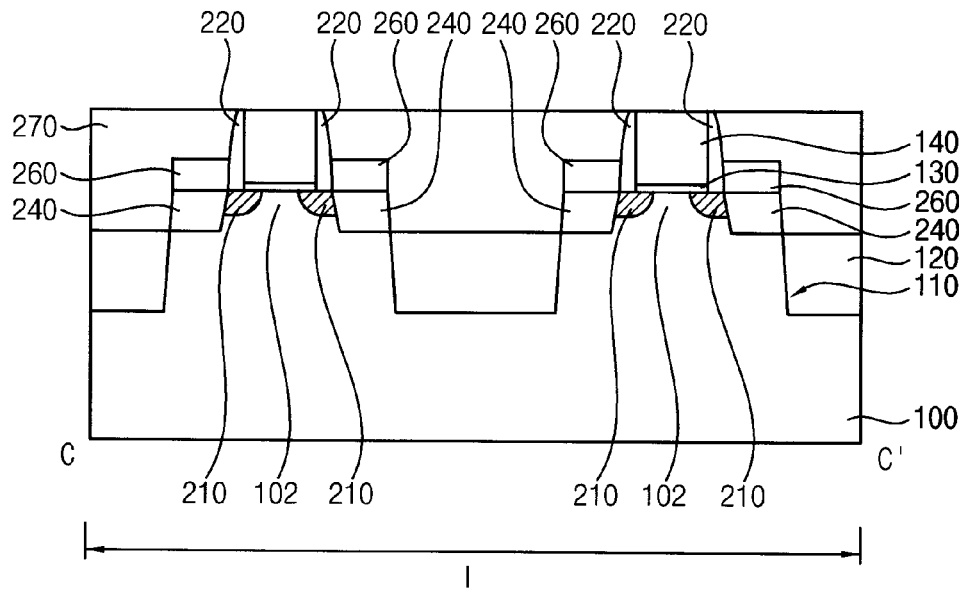
Figure 40:
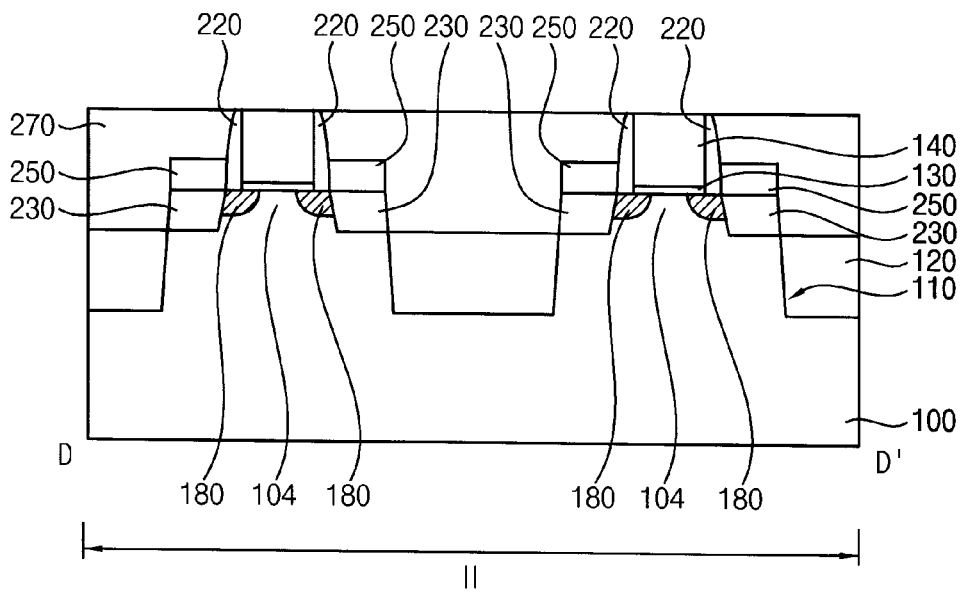

Referring to FIGS. 1, 2A and 3, an upper portion of a substrate 100 may be etched to form a trench 110, and an isolation layer pattern 120 may be formed on the substrate 100 to fill a lower portion of the trench 110.

The substrate 100 may be a silicon substrate, a germanium substrate, a silicon-germanium substrate, a silicon-on-insulator (SOI) substrate, a germanium-on-insulator (GOI) substrate, etc. The substrate 100 may be divided into a first region I and a second region II. In example embodiments, the first region I may serve as a negative-channel metal oxide semiconductor (NMOS) region in which NMOS transistors may be formed, and the second region II may serve as a positive-channel metal oxide semiconductor (PMOS) region in which PMOS transistors may be formed. FIG. 1 shows that the first region I and the second region II are alternatingly and repeatedly arranged in a first direction substantially parallel to a top surface of the substrate 100, however, the layout of the first and second regions I and II may not be limited thereto, but may have various modifications.

In example embodiments, the isolation layer pattern 120 may be formed by forming an isolation layer on the substrate 100 to sufficiently fill the trench 110, planarizing the isolation layer until the top surface of the substrate 100 may be exposed, and removing an upper portion of the isolation layer to expose an upper portion of the trench 110. The isolation layer may be formed to include an oxide, e.g., silicon oxide.

After forming the isolation layer pattern 120, a field region on which the isolation layer pattern 120 is formed and an active region on which no isolation layer is formed may be defined in the substrate 100. The active region may have a fin shape protruding from the isolation layer pattern 120, and thus may be referred to as an active fin.

Figure 2B:
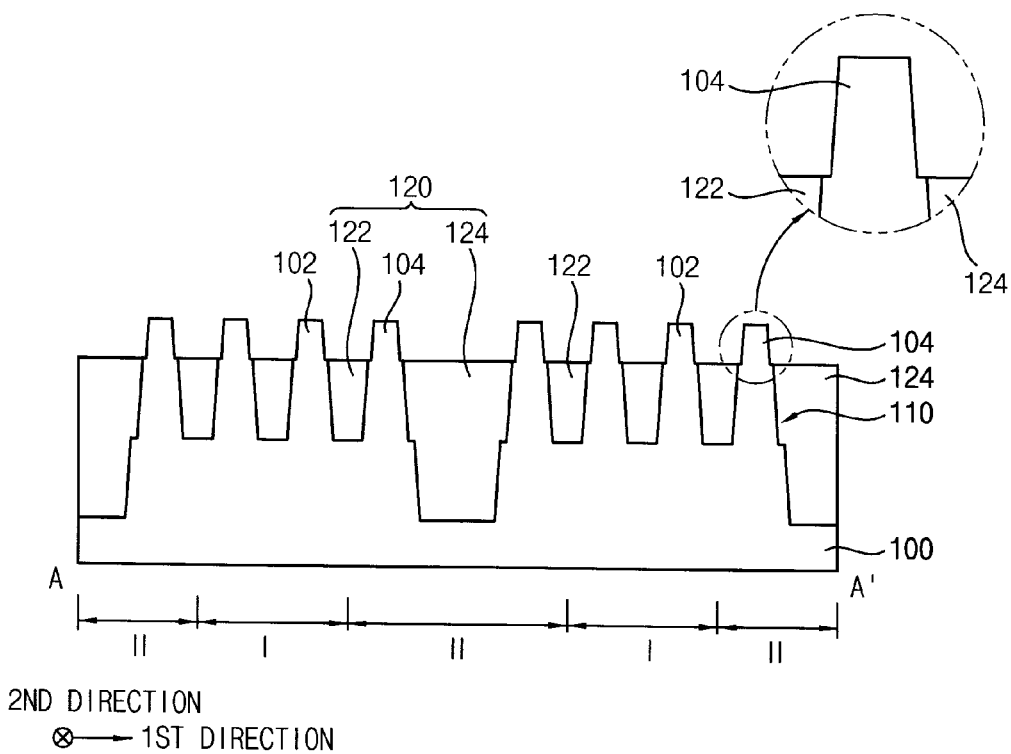

Referring to FIG. 2B, when forming the isolation layer pattern 120 by removing the upper portion of the isolation layer to expose the upper portion of the trench 110, an upper portion of the substrate 100 exposed by the trench 110 may be also removed. Thus, an upper portion of the active fin not covered by the isolation layer pattern 120 may have a width smaller than that of a lower portion thereof covered by the isolation layer pattern 120.

The isolation layer pattern 120 may be divided into a first isolation layer pattern 122 having a relatively smaller width and a second isolation layer pattern 124 having a relatively larger width, and the second isolation layer pattern 124 may have a depth toward an inner portion of the substrate 100 greater than that of the first isolation layer pattern 122.

Hereinafter, active fins and isolation layer patterns having the same shapes as those in FIG. 2A will be illustrated. However, the invention is not limited hereto.

In example embodiments, a plurality of active regions may be formed in the first direction and in a second direction. The first and second directions are substantially parallel to the top surface of the substrate 100, and the second direction is substantially perpendicular to the first direction. Thus, a plurality of active regions may be formed in each of the first region I and the second region II. Hereinafter, the active regions in the first region I may be referred to as first active regions 102, and the active regions in the second region II may be referred to as second active regions 104.

Referring to FIGS. 4 to 7, a first gate structure may be formed on the substrate 100 and on the isolation layer pattern 120.

The first gate structure may be formed by the following process. A gate insulation layer, a dummy gate electrode layer and a gate mask layer are sequentially formed on the first and second active regions 102 and 104 of the substrate 100 and the isolation layer pattern 120. The gate mask layer is patterned by a photolithography process using a photoresist pattern (not shown) to form a gate mask 150. The dummy gate electrode layer and the gate insulation layer are patterned using the gate mask 150 as an etching mask. The first gate structure may include a gate insulation layer pattern 130, a dummy gate electrode 140 and a gate mask 150 sequentially stacked on the substrate 100 and on the isolation layer pattern 120. The first gate structure may be referred to as a dummy gate structure.

The gate insulation layer may include an oxide, e.g., silicon oxide, the dummy gate electrode layer may include, e.g., polysilicon, and the gate mask layer may include a nitride, e.g., silicon nitride. The gate insulation layer may be formed by a chemical vapor deposition (CVD) process, an atomic layer deposition (ALD) process, etc. Alternatively, the gate insulation layer may be formed by a thermal oxidation process that treats an upper portion of the substrate 100 to form, for example, a silicon oxide layer. The dummy gate electrode layer and the gate mask layer may be formed by a CVD process, an ALD process, etc.

In example embodiments, the first gate structure may be formed on the first and second active regions 102 and 104 of the substrate 100 and on the isolation layer pattern 120. The first gate structure extends in the first direction, and a plurality of first gate structures may be formed in the second direction. One of the plurality of first gate structures may be formed in each of the first and second active regions 102 and 104.

Alternatively, the first gate structure may not be formed on the isolation layer pattern 120 but only on the first and second active regions 102 and 104 of the substrate 100.

The width of the first gate structure may be smaller than the width of each of the first and second active regions 102 and 104 in the second direction. In example embodiments, the first gate structure may be formed to cover a central portion of each of the first and second active regions 102 and 104 in the second direction, and thus an edge portion of each of the first and second active regions 102 and 104 may not be covered by the first gate structure.

Referring to FIGS. 8 to 11, a first anti-reflective layer 160 may be formed on the isolation layer pattern 120 and the edge portions of the first and second active regions 102 and 104 not covered by the first gate structure.

In example embodiments, the first anti-reflective layer 160 may be formed by spin-coating an anti-reflective material to form a preliminary first anti-reflective layer and baking the preliminary first anti-reflective layer.

In example embodiments, the spin-coating process may be performed under conditions having good gap-fill characteristics, so that the first anti-reflective layer 160 may be formed only on the isolation layer pattern 120 and the first and second active regions 102 and 104. For example, the first anti-reflective layer may not be formed on the first gate structure having a height greater than those of the isolation layer pattern 120 and the first and second active regions 102 and 104. In an example embodiment, the baking process may be performed at a temperature between about 150° C. and about 300° C.

The anti-reflective material may include, e.g., a polymer containing an imide group and a solvent. In example embodiments, the first anti-reflective layer 160 may be formed to have a thickness about 150 Å or less.

Referring to FIGS. 12 to 15, a first photoresist layer 170 may be formed on the first anti-reflective layer 160 and the first gate structure.

The first photoresist layer 170 may be formed using, e.g., acetal, acrylate, ESCAP, cyclo olefin-maleic anhydride copolymer (COMA), hybrid of COMA and acrylate, etc.

After forming the first photoresist layer 170, a baking process may be further performed at a temperature between about 70° C. and about 200° C.

Referring to FIGS. 16 to 19, the first photoresist layer 170 may be partially etched to form a photoresist pattern 175 covering the first region I and exposing the second region II. For example, the first photoresist pattern 175 may be formed on the first anti-reflective layer 160 and the first gate structure to cover the first active regions 102 in the first region I and a portion of the isolation layer pattern 120 adjacent thereto.

In example embodiments, the first photoresist pattern 175 may be formed by a light exposure process (hereinafter "exposure process") and a developing process on the first photoresist layer 170.

In the exposure process, a photo mask (not shown) may be disposed over or on the first photoresist layer 170. The photo mask has an opening pattern (not shown) through which the light passes to reach the first photoresist layer 170. The first photoresist layer 170 may react with the light in the exposed portion. The light may include, e.g., KrF, ArF, extreme ultra violet (EUV), vacuum ultra violet (VUV), electron beam, X-ray, or ion beam. After the photoresist layer 170 is exposed to the light, the substrate 100 may be baked at a temperature between about 70° C. and about 200° C.

When performing the exposure process, the first anti-reflective layer 160 is formed under the first photoresist layer 170 so as to prevent diffuse reflection of light. Thus, a desired portion of the first photoresist layer 170 is exposed to the light while the other portion is protected by the photo mask. The first anti-reflective layer 160 is formed on the fin-shaped first and second active regions 102 and 104 protruding from the isolation layer pattern 120 so as to effectively prevent diffuse reflection of light.

In the developing process, a portion of the first photoresist layer 170 reacted with the light may be solved by a developer to be removed. The developer may include, e.g., tetra-methyl ammonium hydroxide (TMAH) solution. For example, the TMAH solution includes about 0.01 to about 5 weight percent of TMAH.

As illustrated above, the first anti-reflective layer 160 may reduce or prevent diffuse reflection of light in the exposure process so that a light may be more precisely emitted onto the desired portion of the first photoresist layer 170, and thus the desired portion of the first photoresist layer 170 may be more precisely removed in the developing process. For example, the first photoresist pattern 175 may be formed to have a vertical profile with no or an insubstantial rounded lower portion and/or no or an insubstantial undercut.

Referring to FIGS. 20 to 23, a first ion implantation process may be performed using the first photoresist pattern 175 and the first gate structure as an ion implantation mask to form a first impurity region 180 at upper portions of the second active regions 104 adjacent to the first gate structure.

Even though the first anti-reflective layer 160 is formed on the second active regions 104, the thickness of the first anti-reflective layer 160 is so small that conditions of the first ion implantation process may not be influenced by the first anti-reflective layer 160. For example, when a thick anti-reflective layer is formed on the second active regions 104, the anti-reflective layer may be removed by an additional etching process so as to maintain the original conditions for an ion implantation process. When the thick anti-reflective layer is not removed, the thick anti-reflective layer may be an obstacle to an ion implantation process. For example, the thick anti-reflective layer may block or absorb ions used for the ion implantation. However, the etching process removing the anti-reflective layer may damage the second active regions 104 beneath the anti-reflective layer, and may deteriorate characteristics of devices subsequently formed.

In example embodiments, the first anti-reflective layer 160 may be formed to have a thin thickness so as not to significantly influence the ion implantation of the second active regions 104. For example, the original ion implantation process conditions used for a structure without an anti-reflective layer may be used for an ion implantation process with the first anti-reflective layer 160. Thus, the first anti-reflective layer 160 may not be removed in some processes. An additional etching process may not be required, and the second active regions 104 beneath the first anti-reflective layer 160 may maintain a good condition.

In example embodiments, the first impurity region 180 may be formed not only at portions of the second active regions 104 not covered by the first gate structure but also at portions of the second active regions 104 covered by the first gate structure by a tilted ion implantation process.

The first impurity region 180 may be formed to include p-type impurities, e.g., boron (B), gallium (Ga), etc. The first impurity region 180 may be referred to as a first halo region.

The first photoresist pattern 175 may be removed by an ashing process and/or a stripping process, and the first anti-reflective layer 160 thereunder may be also removed.

Referring to FIGS. 24 to 27, a second impurity region 210 may be formed in the first active regions 102. The other processes are substantially the same as or similar to those illustrated with reference to FIGS. 8 to 23.

For example, a second anti-reflective layer 190 may be formed on the isolation layer pattern 120 and the edge portions of the first and second active regions 102 and 104 not covered by the first gate structure. A second photoresist layer 200 may be formed on the second anti-reflective layer 190 and the first gate structure.

The second photoresist layer 200 may be partially removed to form a second photoresist pattern 205 covering a second region II and exposing the first region I of the substrate 100. For example, the second photoresist pattern 205 may be formed on the second anti-reflective layer 190 and the first gate structure to cover the second active regions 104 in the second region II and a portion of the isolation layer pattern 120 adjacent thereto.

The second photoresist pattern 205 may be formed by an exposure process and a developing process on the second photoresist layer 200, and the second anti-reflective layer 190 is formed under the second photoresist layer 200 so as to prevent or reduce diffuse reflection of light. For example, a light may exactly emit onto a desired portion of the second photoresist pattern 200. The second anti-reflective layer 190 is formed on the fin-shaped first and second active regions 102 and 104 protruding from the isolation layer pattern 120 so as to effectively prevent diffuse reflection of light. For example, the second photoresist pattern 205 may be formed to have a vertical profile with no or less rounded lower portion and/or no or less undercut.

A second ion implantation process may be performed using the second photoresist pattern 205 and the first gate structure as an ion implantation mask to form the second impurity region 210 at upper portions of the first active regions 102 adjacent to the first gate structure. Even though the second anti-reflective layer 190 is formed on the first active regions 102, the thickness of the second anti-reflective layer 190 is so small that the second anti-reflective layer 190 may not affect the second ion implantation. The second anti-reflective layer 190 may not affect the ion implantation quality of the first active region 102. For example, the conditions of the second ion implantation process that are used for a structure not having the second anti-reflective layer 190 may also be used for a structure having the second anti-reflective layer 190. For example, the second anti-reflective layer 190 may not be removed before the ion implantation process of the first active region 102. For example, the second anti-reflective layer 190 may not be removed by an additional etching process. Accordingly, the first active regions 102 under the second anti-reflective layer 190 may not be damaged by an additional etching process.

In example embodiments, the second impurity region 210 may be formed not only at portions of the first active regions 102 not covered by the first gate structure but also at some portions of the first active regions 102 covered by the first gate structure by a tilted ion implantation process.

The second impurity region 210 may be formed to include n-type impurities, e.g., phosphorous (P), arsenic (As), etc. The second impurity region 210 may be referred to as a second halo region.

The second photoresist pattern 205 may be removed by an ashing process and/or a stripping process, and the second anti-reflective layer 190 thereunder may be also removed.

Referring to FIGS. 28 to 32, a spacer 220 may be formed on a sidewall of the first gate structure.

The spacer 220 may be formed by forming a spacer layer on the substrate 100 and the isolation layer pattern 120 to cover the first gate structure, and patterning the spacer layer. For example, the spacer layer may be anisotropically etched to form the spacer 220. The spacer 220 may be formed to partially cover the second and first impurity regions 210 and 180 in the first and second active regions 102 and 104, respectively.

For example, the spacer layer may include a nitride, e.g., silicon nitride. The spacer layer may be formed by an ALD process, a CVD process, etc.

Referring to FIGS. 33 to 36, a first source/drain layer 230 may be formed on each of the second active regions 104 adjacent to the first gate structure, and a first elevated source drain (ESD) layer 250 may be formed on the first source/drain layer 230. Additionally, a second source/drain layer 240 may be formed on each of the first active regions 102 adjacent to the first gate structure, and a second ESD layer 260 may be formed on the second source/drain layer 240.

For example, a photoresist pattern (not shown) covering the first region I of the substrate 100 may be formed, an upper portion of each second active region 104 may be removed using the photoresist pattern, the first gate structure and the spacer 220 as an etching mask to form a first recess (not shown), and the first source/drain layer 230 may be formed to fill the first recess.

In example embodiments, a first selective epitaxial growth (SEG) process may be performed using an upper portion of each second active region 104 exposed by the first recess as a seed to form the first source/drain layer 230. The first SEG process may be performed using, e.g., disilane ($Si_2H_6$) gas and monomethylsilane ($SiH_3CH_3$) gas as a source gas to form a single crystalline silicon carbide layer. In example embodiments, an n-type impurity source gas, e.g., phosphine ($PH_3$) gas may be also used to form a single crystalline silicon carbide layer doped with n-type impurities. For example, the first source/drain layer 230 may serve as a source/drain region of a negative-channel metal oxide semiconductor (NMOS) transistor.

A second SEG process may be performed to form the first ESD layer 250 on the first source/drain layer 230. The second SEG process may be performed using the first source/drain layer 230 as a seed. The second SEG process may be performed using, e.g., disilane ($Si_2H_6$) gas and an n-type impurity source gas, e.g., phosphine ($PH_3$) gas so that a single crystalline silicon layer doped with n-type impurities may be formed.

In example embodiments, the first SEG process for forming the first source/drain layer 230 and the second SEG process for forming the first ESD layer 250 may be performed in-situ. For example, when the first source/drain layer 230 is formed, a silicon source gas, a carbon source gas and an n-type impurity source gas may be provided to perform an SEG process. Then, the carbon source gas is not provided while the silicon source gas and the n-type impurity source gas are still provided to form the first ESD layer 250.

After the first and second SEG processes finish, the photoresist pattern may be removed.

A photoresist pattern (not shown) covering the second region II of the substrate 100 may be formed. An upper portion of each first active region 102 may be removed using the photoresist pattern, the first gate structure and the spacer 220 as an etching mask to form a second recess (not shown), and the second source/drain layer 240 may be formed to fill the second recess.

In example embodiments, a third SEG process may be performed using an upper portion of each first active region 102 exposed by the second recess as a seed to form the second source/drain layer 240. The third SEG process may be performed using, e.g., dichlorosilane ($SiH_2Cl_2$) gas, germane ($GeH_4$) gas, etc., as a source gas, and thus a single crystalline silicon-germanium layer may be formed. In example embodiments, a p-type impurity source gas, e.g., diborane ($B_2H_6$) gas may be also used to form a single crystalline silicon-germanium layer doped with p-type impurities. For example, the second source/drain layer 240 may serve as a source/drain region of a positive-channel metal oxide semiconductor (PMOS) transistor.

A fourth SEG process may be performed to form the second ESD layer 260 on the second source/drain layer 240. The fourth SEG process may be performed using the second source/drain layer 240 as a seed. The fourth SEG process may be performed using, e.g., dichlorosilane ($SiH_2Cl_2$) gas and a p-type impurity source gas, e.g., diborane ($B_2H_6$) gas so that a single crystalline silicon layer doped with p-type impurities.

In example embodiments, the third SEG process for forming the second source/drain layer 240 and the fourth SEG process for forming the second ESD layer 260 may be performed in-situ. For example, when the second source/drain layer 240 may be formed, a silicon source gas, a germanium source gas and a p-type impurity source gas may be provided to perform an SEG process, and providing the germanium source gas may be stopped to form the second ESD layer 260. After the third and fourth SEG processes, the photoresist pattern may be removed.

In some embodiments, the first and second source/drain layers 230 and 240 are formed by forming recesses and performing SEG processes as described above. In some other embodiments, the first and second source/drain layers 230 and 240 may be formed simply by implanting impurities onto upper portions of the first and second active regions 102 and 104 of the substrate 10 adjacent to the first gate structure. In some embodiments, the first and second ESD layers 250 and 260 are formed on the first and second source/drain layers 230 and 240, respectively, as described above. In some other embodiments, the first and second ESD layers 250 and 260 may not be formed on the substrate. The semiconductor device may not include one or both of the first and second ESD layers 250 and 260.

Portions of the first and second impurity regions 180 and 210 not covered by the first gate structure and the spacer 220 may be removed by the first and second recesses for forming the first and second source/drain layers 230 and 240, and thus sidewalls of the first and second impurity regions 180 and 210 may contact the first and second source/drain layers 230 and 240, respectively, on the first and second recesses. In an example embodiment, bottom surfaces of the first and second source/drain layers 230 and 240 may be substantially coplanar with a top surface of the isolation layer pattern 120. In some other embodiments, the bottom surfaces of the first and second source/drain layers 230 and 240 may be higher or lower than the top surface of the isolation layer pattern 120.

Referring to FIGS. 37 to 40, an insulating interlayer 270 covering the first gate structure, the spacer 220 and the first and second ESD layers 250 and 260 may be formed on the substrate 100 and the isolation layer pattern 120. The insulating interlayer 270 may be planarized until a top surface of the dummy gate electrode 140 of the first gate structure is exposed. The gate mask 150 of the first gate structure and an upper portion of the spacer 220 may be also removed. In example embodiments, the planarization process of the insulating interlayer 270 may be performed by a chemical mechanical polishing (CMP) process and/or an etch back process.

Figure 41:
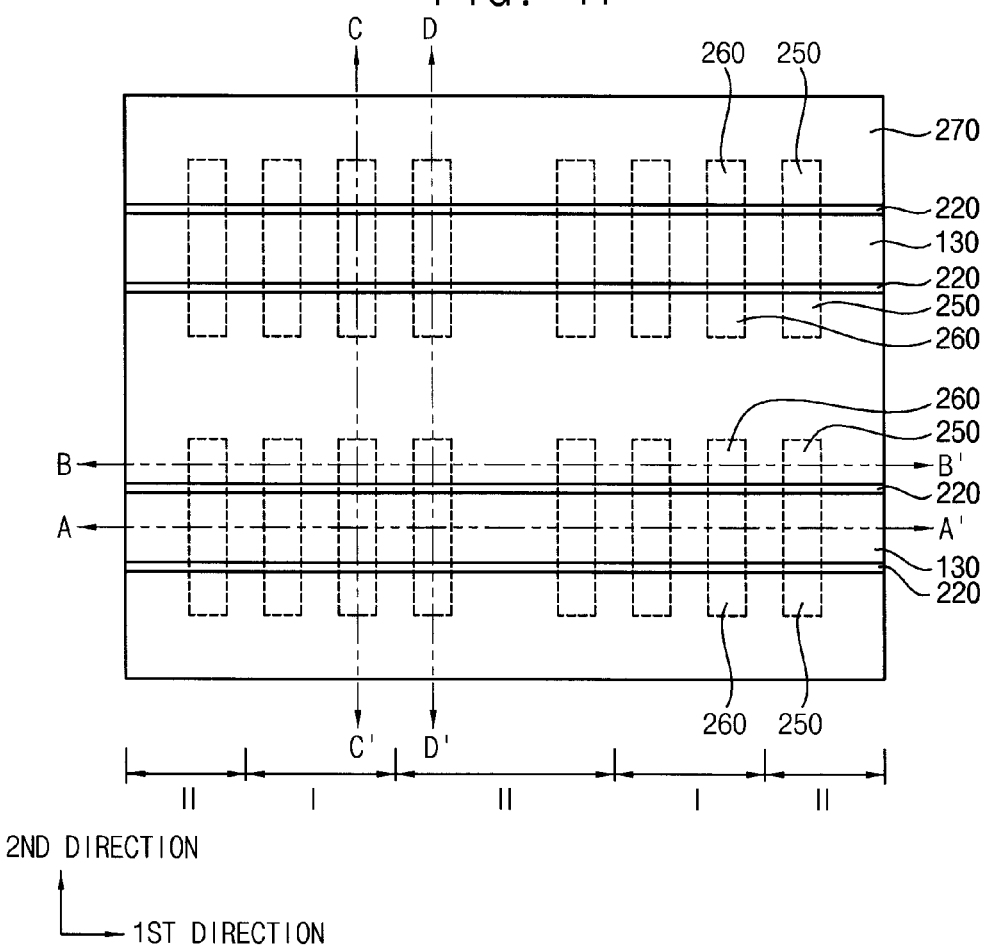
Figure 42:
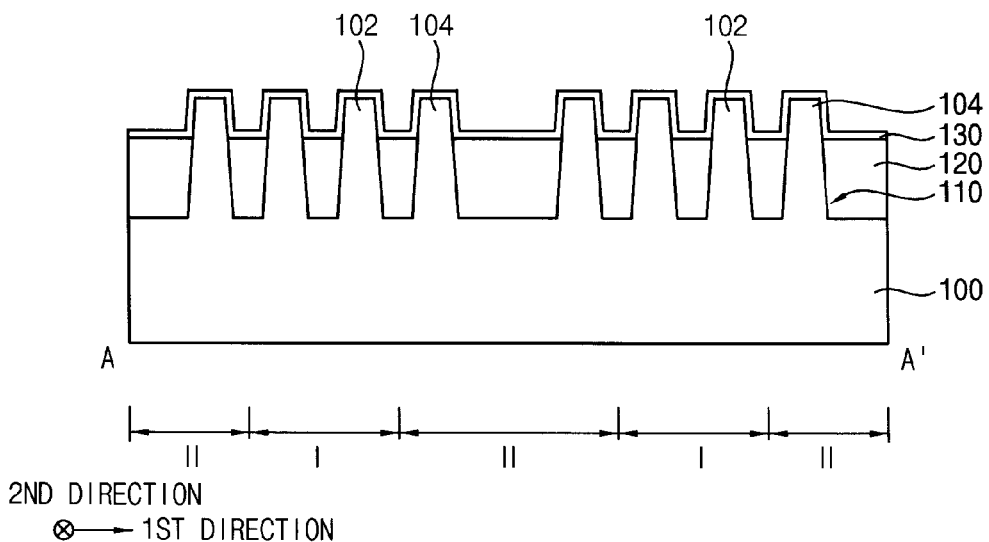
Figure 43:
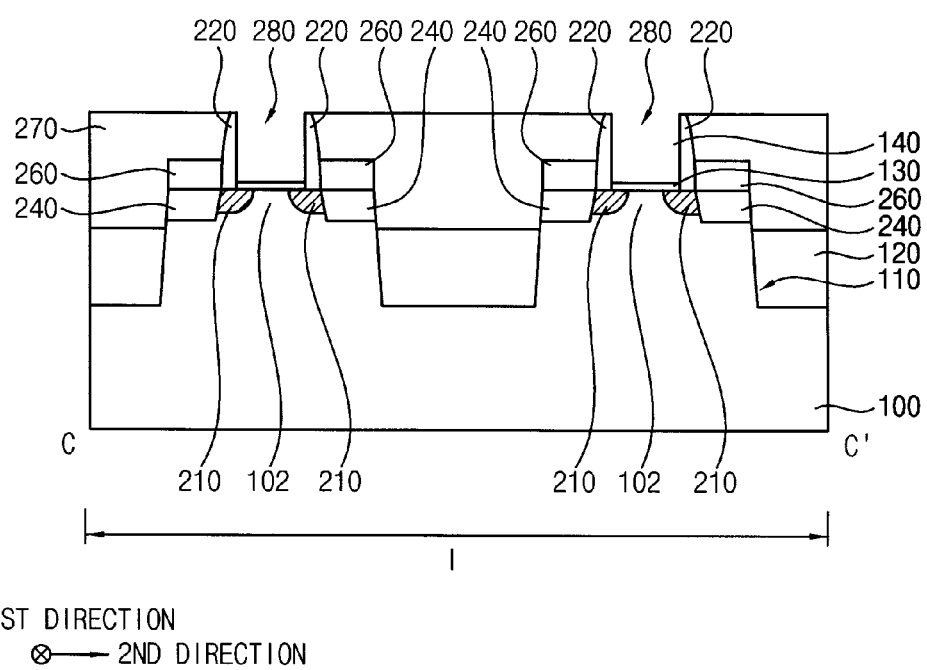

Referring to FIGS. 41 to 43, the exposed dummy gate electrode 140 may be removed to form an opening 280 exposing a top surface of the gate insulation layer pattern 130.

In example embodiments, the dummy gate electrode 140 may be removed by a dry etching process and then a wet etching process. The wet etching process may be performed using HF as an etching solution.

Figure 44:
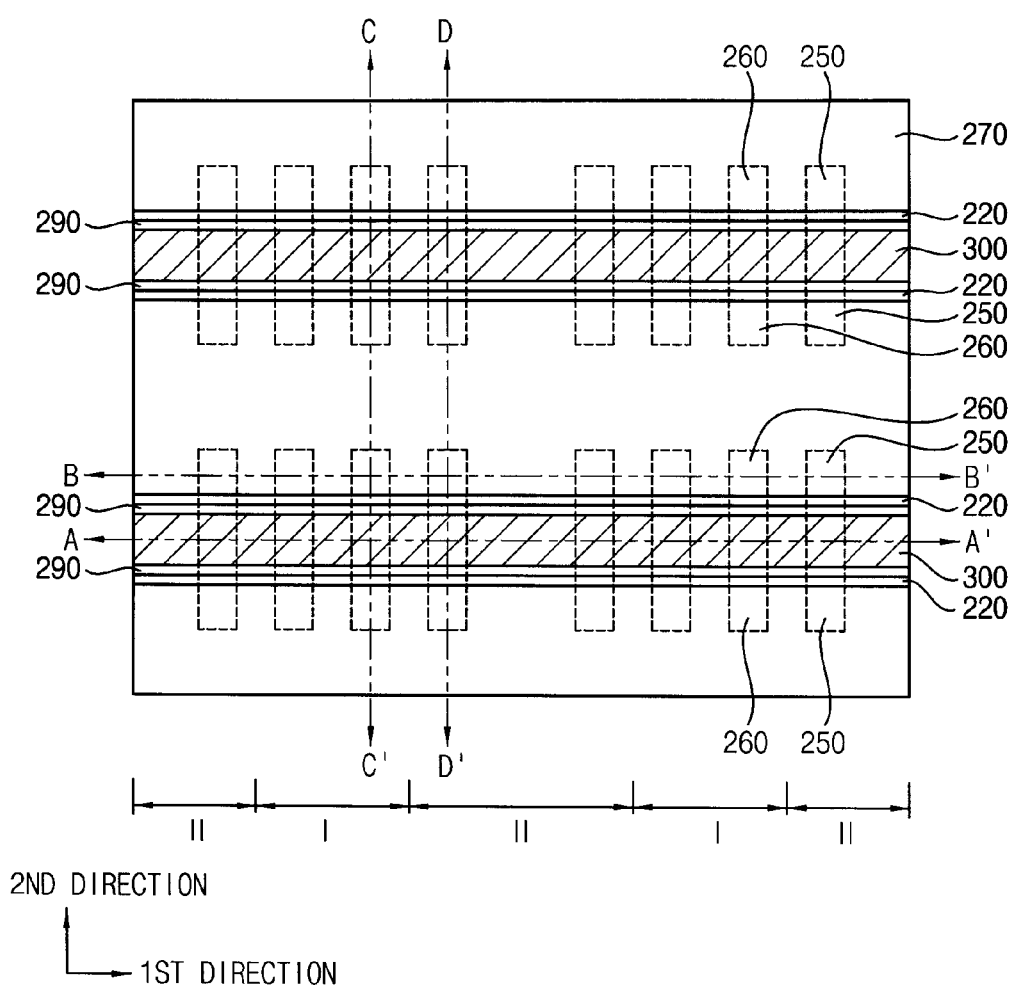
Figure 45:
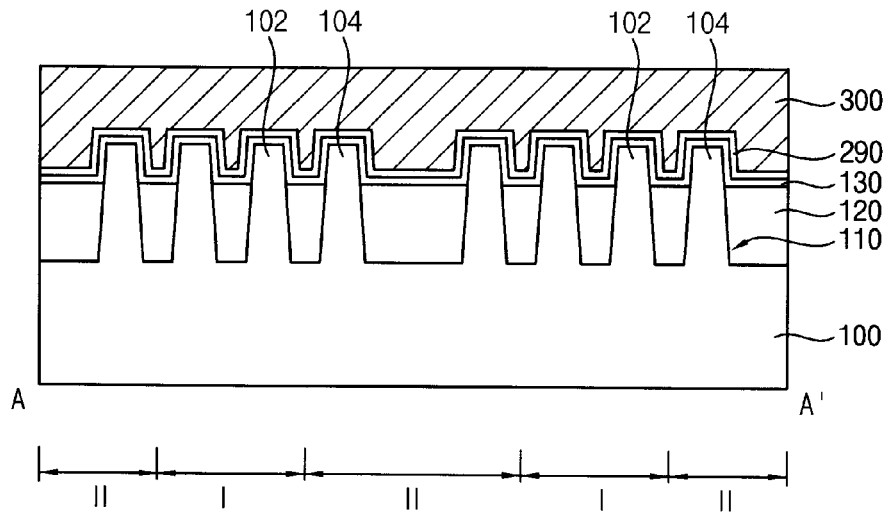
Figure 46:
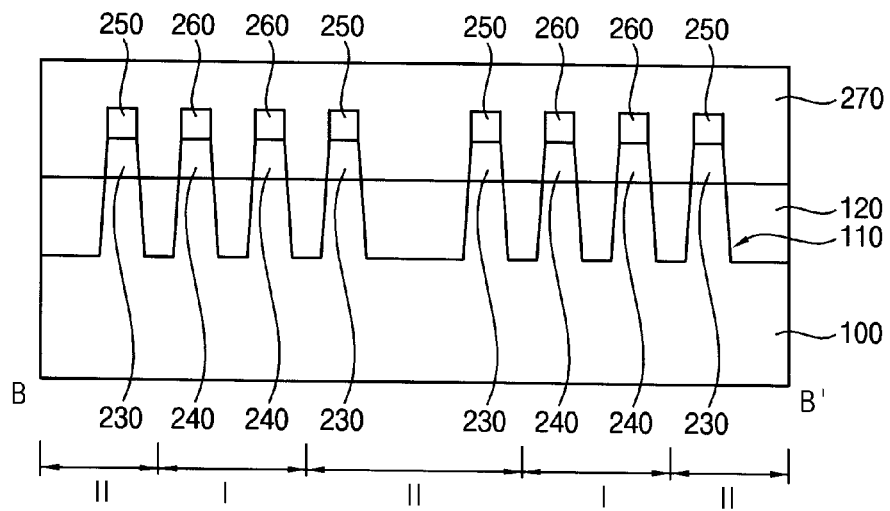
Figure 47:
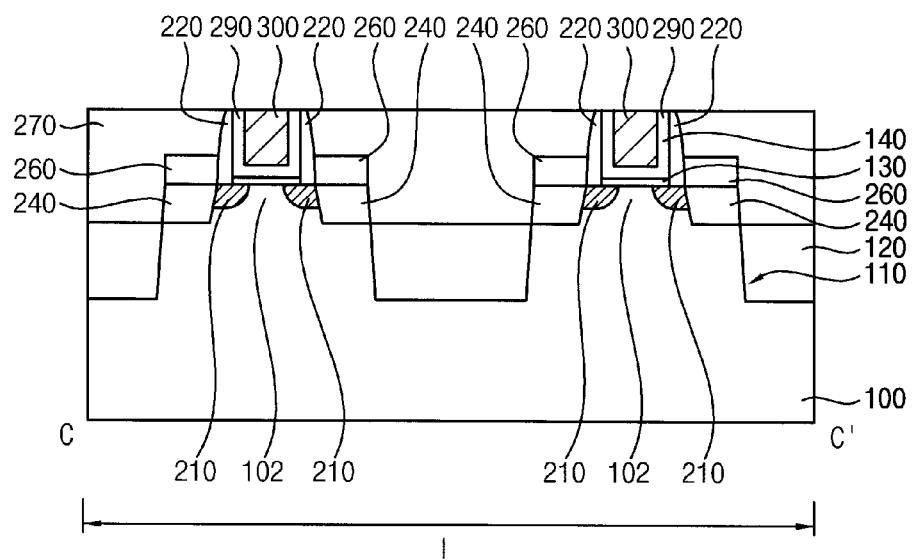
Figure 48:
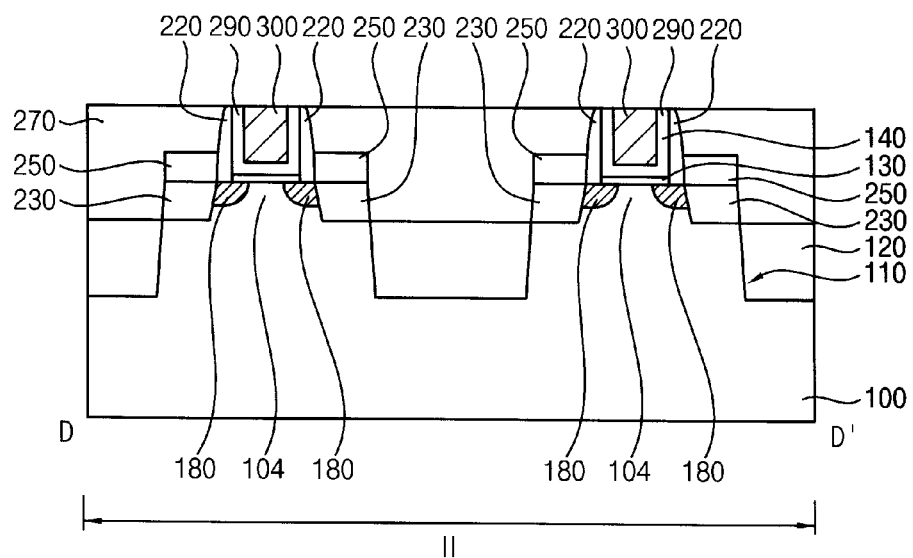

Referring to FIGS. 44 to 46, a high-k dielectric layer pattern 290 and a gate electrode 330 may be formed to fill the opening 280.

For example, a high-k dielectric layer may be formed on the exposed top surface of the gate insulation layer pattern 130, a sidewall of the opening 280 and a top surface of the insulating interlayer 270, and a gate electrode layer may be formed on the high-k dielectric layer to sufficiently fill the opening 280.

The high-k dielectric layer may be formed to include a metal oxide having a high dielectric constant, e.g., hafnium oxide, tantalum oxide, zirconium oxide, etc. The gate electrode layer may be formed to include a material having a low resistance, e.g., a metal such as aluminum, copper, tantalum, etc., or a metal nitride thereof by an ALD process, a physical vapor deposition (PVD) process, etc. In an example embodiment, a heat treatment process, e.g., a rapid thermal annealing (RTA) process, a spike rapid thermal annealing (spike RTA) process, a flash rapid thermal annealing (flash RTA) process or a laser annealing process may be further performed. Alternatively, the gate electrode layer may be formed to include doped polysilicon.

The gate electrode layer and the high-k dielectric layer may be planarized until the top surface of the insulating interlayer 270 may be exposed to form a high-k dielectric layer pattern 290 on the top surface of the gate insulation layer pattern 130 and the sidewall of the opening 280, and a gate electrode layer 300 filling a remaining portion of the opening 280 on the high-k dielectric layer pattern 290. Thus, a bottom and a sidewall of the gate electrode 300 may be covered by the high-k dielectric layer pattern 290. In example embodiments, the planarization process may be performed by a CMP process and/or an etch back process.

A second gate structure is formed by the above processes. The second gate structure includes sequentially stacked layers of the gate insulation layer pattern 130, the high-k dielectric layer pattern 290 and the gate electrode 300.

The second gate structure, the first impurity region 180, the first source/drain layer 230 and the first ESD layer 250 may form an NMOS transistor. The second gate structure, the second impurity region 210, the second source/drain layer 240 and the second ESD layer 260 may form a PMOS transistor.

An insulating interlayer (not shown) may be further formed to cover the transistors. A contact plug (not shown) and a wiring (not shown) may be formed through the insulating interlayer to be electrically connected to the first ESD layer 250, the second ESD layer 260 and/or the second gate structure.

As illustrated above, in the method of manufacturing the semiconductor device, when the ion implantation process is performed to form the first and second impurity regions 180 and 210, after forming the anti-reflective layers 160 and 190 on the isolation layer pattern 120 and the first and second active regions 102 and 104, the photoresist layers may be formed and patterned to form the photoresist patterns 175 and 205. Thus, the diffuse reflection of light may be reduced by the anti-reflective layers 160 and 190 so that each of the photoresist patterns 175 and 205 may have a vertical profile. Additionally, each of the anti-reflective layers 160 and 190 may be formed to have a thin thickness so as not to influence the conditions for the ion implantation process. Thus, the anti-reflective layers 160 and 190 may not be etched so that the first and second active regions 102 and 104 may not be damaged due to the etching of the anti-reflective layers 160 and 190. Accordingly, the semiconductor device may have good characteristics.

FIGS. 49 to 59 are plan views and cross-sectional views illustrating stages of a method of manufacturing a semiconductor device in accordance with example embodiments. Particularly, FIGS. 49, 52, 54 and 57 are plan views illustrating stages of the method of manufacturing the semiconductor device, and FIGS. 50, 51, 53, 55, 56, 58 and 59 are cross-sectional views illustrating stages of the method of manufacturing the semiconductor device.

Figure 51:
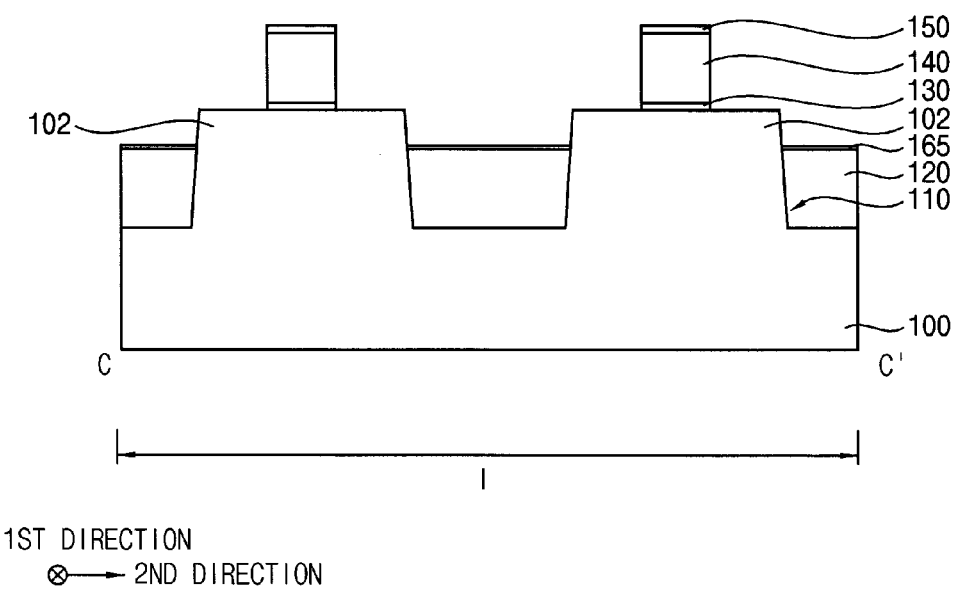
Figure 55:
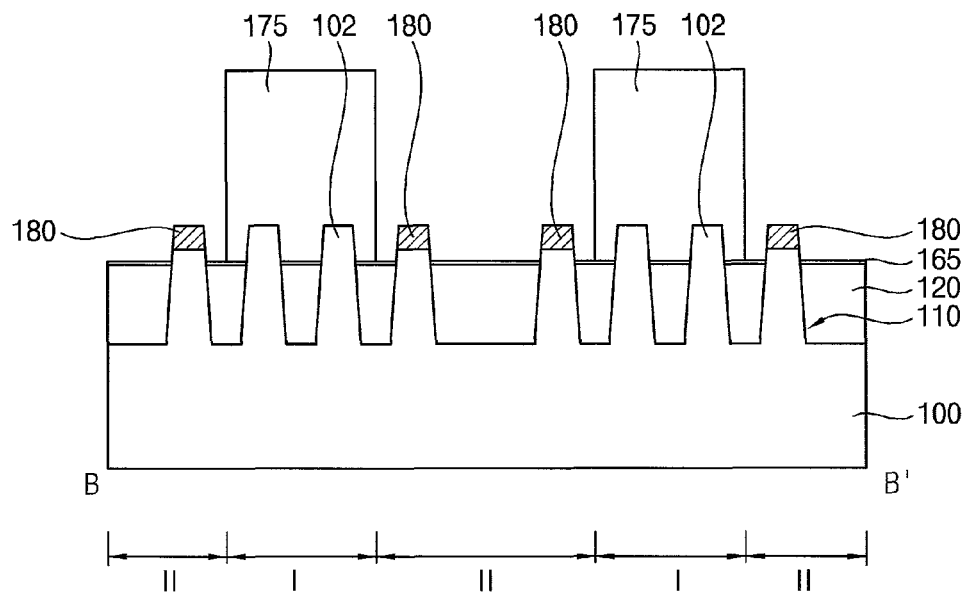
Figure 56:
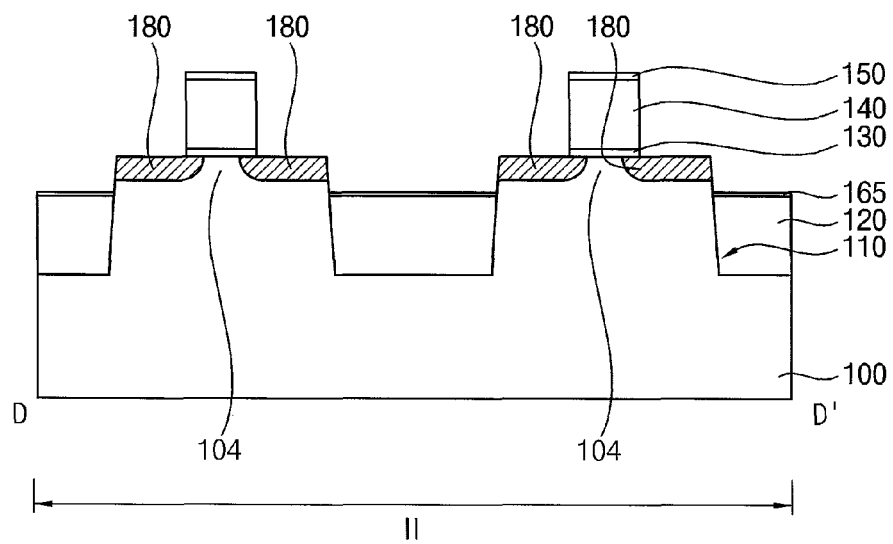
Figure 58:
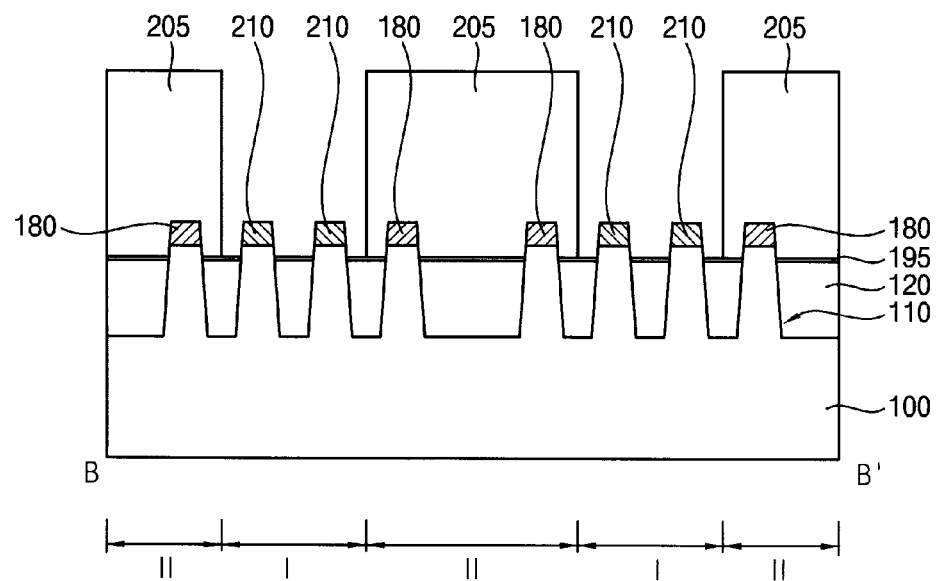
Figure 59:
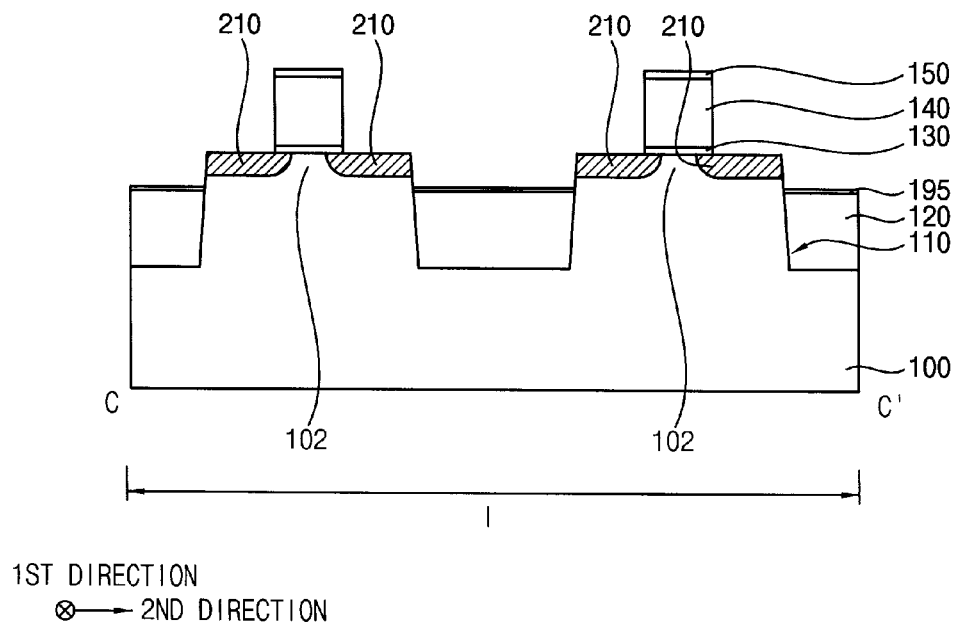

FIGS. 50, 53, 55 and 58 are cross-sectional views cut along a line B-B' of the corresponding plan views, FIGS. 51 and 59 are cross-sectional views cut along a line C-C' of the corresponding plan views, and FIG. 56 is a cross-sectional view cut along a line D-D' of the corresponding plan view.

First, processes substantially the same as or similar to those illustrated with reference to FIGS. 1 to 7 may be performed.

Referring to FIGS. 49 to 51, a process substantially the same as or similar to that illustrated with reference to FIGS. 8 to 11 may be performed. However, a third anti-reflective layer 165 formed in the process may be formed only on the isolation layer pattern 120, and not be formed on the first and second active regions 102 and 104.

For example, when a spin-coating process is performed to form the third anti-reflective layer 165, process conditions may be adjusted so that the spin-coating process for forming the third anti-reflective layer 165 may have gap-fill characteristics better than that of the spin-coating process for forming the first anti-reflective layer 160. Thus, portions of the first and second active regions 102 and 104 not covered by the first gate structure may not be covered by the third anti-reflective layer 165 but exposed. In an example embodiment, the third anti-reflective layer 165 may be formed to have a thickness about 150 Å or less.

Figure 52:
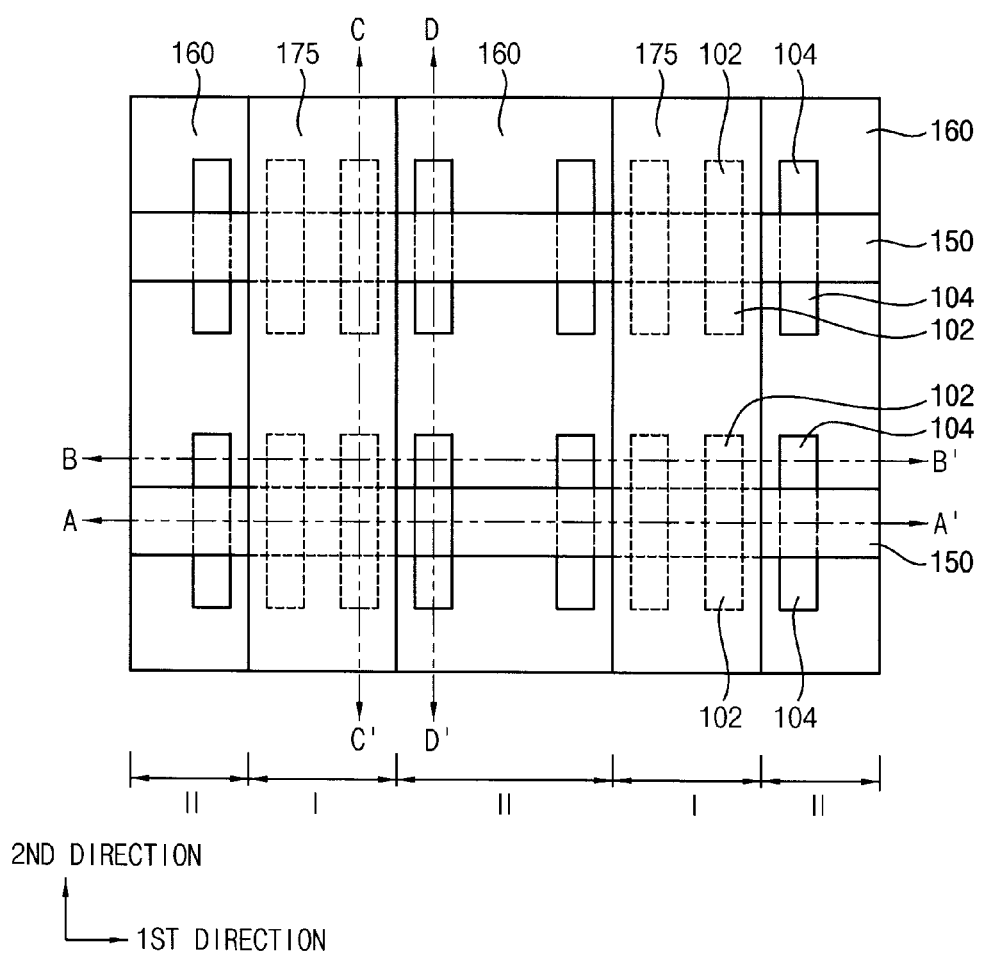
Figure 53:
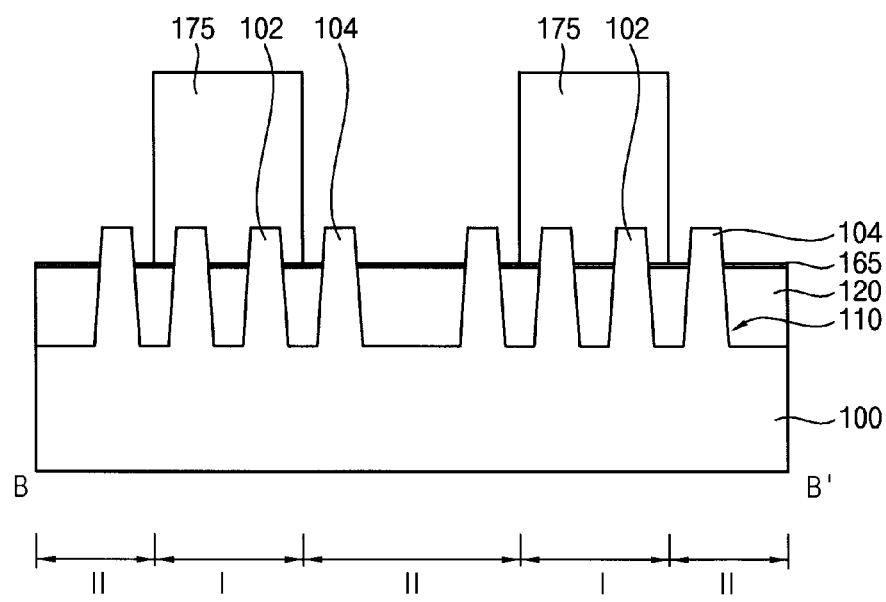

Referring to FIGS. 52 to 53, processes substantially the same as or similar to those illustrated with reference to FIGS. 12 to 19 may be performed.

Thus, a first photoresist layer may be formed on the third anti-reflective layer 165, the first gate structure, and the exposed portions of the first and second active regions 102 and 104, and an exposure process and a developing process may be performed to form a first photoresist pattern 175. The first photoresist pattern 175 may be formed on the first active regions 102 of the first region I, the third anti-reflective layer 165 on a portion of the isolation layer pattern 120 adjacent to the first active regions 102, and the first gate structure.

In the exposure process, the diffuse reflection of light may be prevented or reduced by the third anti-reflective layer 165 so that a light may exactly emit onto a desired portion of the first photoresist layer. Thus, the desired portion of the first photoresist layer may be more precisely removed so that the first photoresist pattern 175 may have a vertical profile with no or less rounded lower portion and/or no or less undercut.

Figure 54:
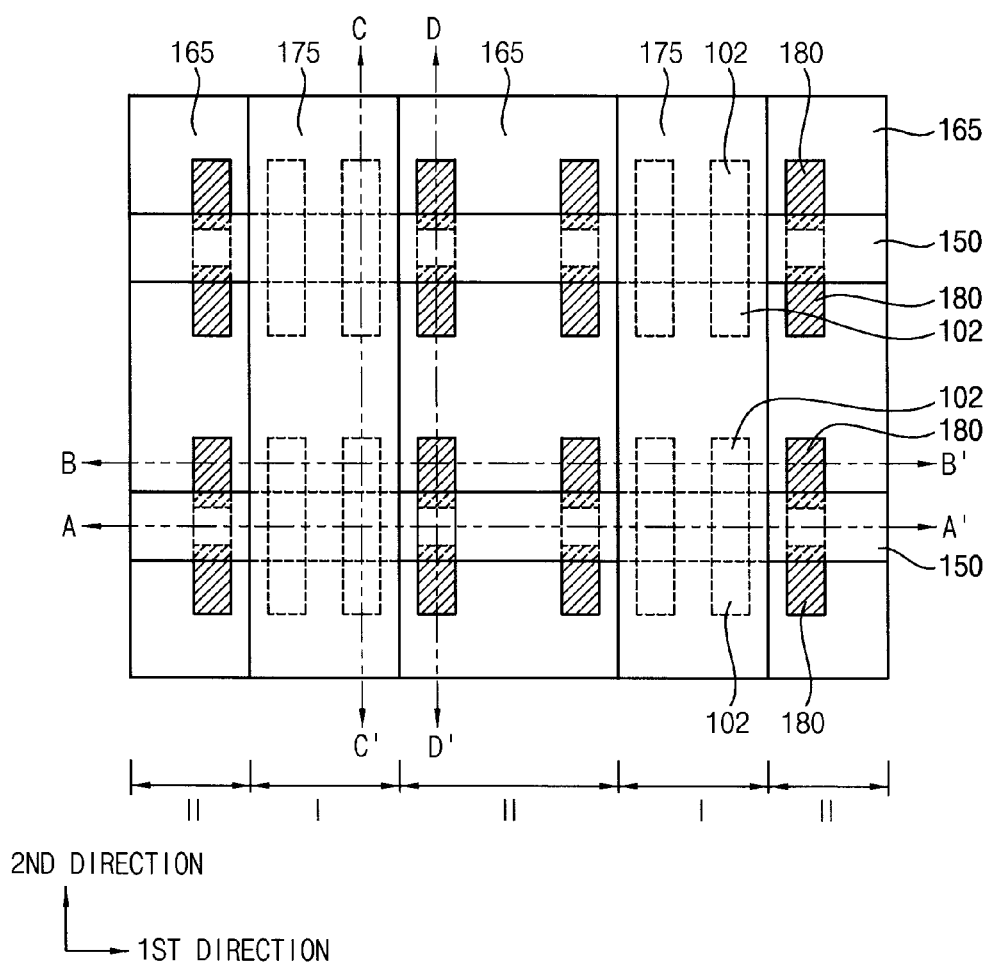

Referring to FIGS. 54 to 56, a process substantially the same as or similar to that illustrated with reference to FIGS. 20 to 23 may be performed.

Thus, a first ion implantation process may be performed using the first photoresist pattern 175 and the first gate structure as an ion implantation mask to form a first impurity region 180 at an upper portion of each second active region 104 adjacent to the first gate structure.

The third anti-reflective layer 165 is not formed on the second active regions 104, and thus the first ion implantation process may be performed without changing the original conditions for the ion implantation process. Additionally, the third anti-reflective layer 165 is not formed on the second active regions 104, and thus the third anti-reflective layer 165 may not be etched so that the second active regions 104 may not be damaged.

Figure 57:
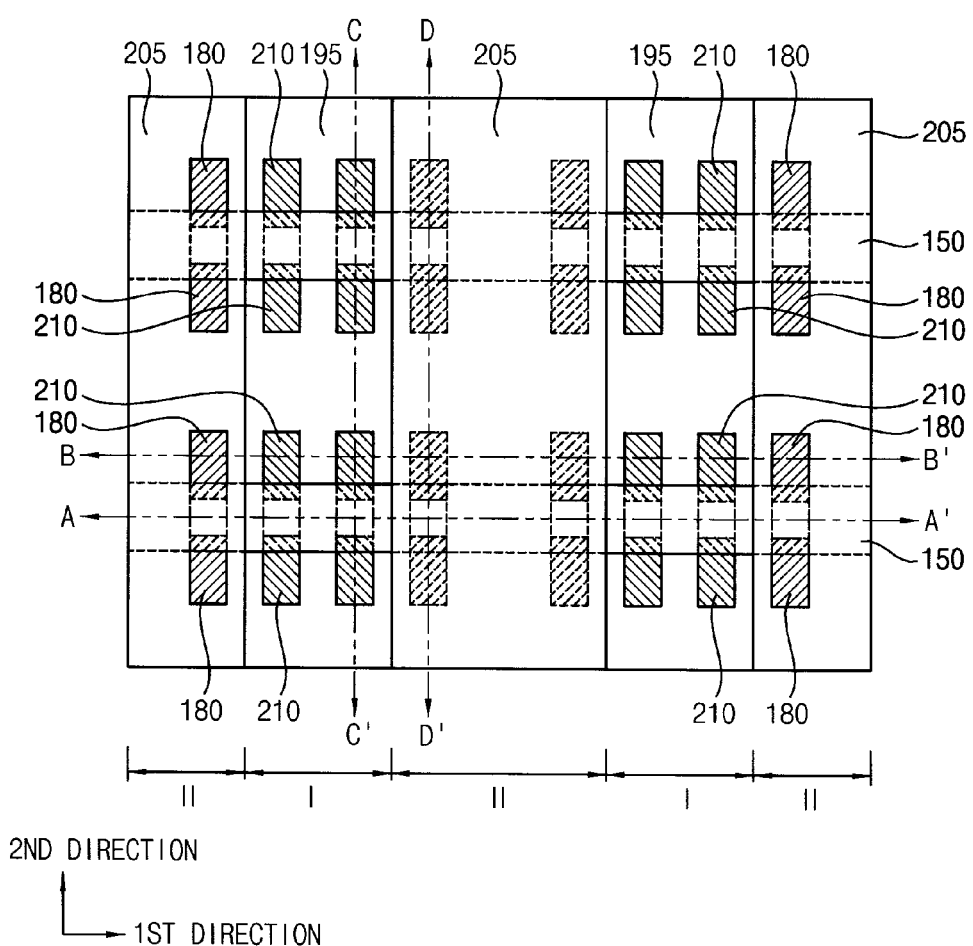

Referring to FIGS. 57 to 59, a process substantially the same as or similar to that illustrated with reference to FIGS. 24 to 27 may be performed. Thus, a fourth anti-reflective layer 195 may be formed on the isolation layer pattern 120, and a second ion implantation process may be performed using a second photoresist pattern 205 and the first gate structure as an ion implantation mask to form a second impurity region 210 at an upper portion of each first active region 102 adjacent to the first gate structure.

The semiconductor device may be completed by performing processes substantially the same as or similar to those illustrated with reference to FIGS. 28 to 48.

As illustrated above, in some embodiments, the anti-reflective layers 165 and 195 are formed on the isolation layer pattern 120. The photoresist layers are formed on the anti-reflective layers and patterned to form the photoresist patterns 175 and 205. The ion implantation process is performed to form the first and second impurity regions 180 and 210. Thus, the diffuse reflection of light may be reduced by the anti-reflective layers 165 and 195 so that each of the photoresist patterns 175 and 205 may have a vertical profile without a dent or deformed shape. In some embodiments, the anti-reflective layers 165 and 195 may not be formed on the active regions 102 and 104. The anti-reflective layers 165 and 195 may be formed only on the isolation layer pattern 120 so as not to influence the conditions for the ion implantation process. Accordingly, the conditions for the ion implantation process may not be changed, and the anti-reflective layers 165 and 196 may not be etched in order to perform the ion implantation process. Thus, the first and second active regions 102 and 104 may not be damaged.

The above method of manufacturing the semiconductor device may be applied to methods of manufacturing various types of memory devices including impurity regions. For example, the method of manufacturing the semiconductor device may be applied to methods of manufacturing logic devices such as central processing units (CPUs), main processing units (MPUs), or application processors (APs), etc. Additionally, the method of manufacturing the semiconductor device may be applied to methods of manufacturing a memory cell region or a peripheral circuit region of volatile memory devices such as DRAM devices or SRAM devices, or non-volatile memory devices such as flash memory devices, PRAM devices, MRAM devices, RRAM devices, etc. These semiconductor devices may be integrated circuit semiconductor chips (and the memory device may be a semicomductor memory chip). For example, the method may further include packaging a semiconductor chip and/or mounting a semiconductor package to an electronic device. The electronic device may be a computer or a mobile device.

The foregoing is illustrative of example embodiments and is not to be construed as limiting the present disclosure. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
    forming an isolation layer pattern on a substrate to define a field region and first and second active regions, the field region being covered by the isolation layer pattern, and the first and second active regions not being covered by the isolation layer pattern and protruding from the isolation layer pattern;
    forming a first anti-reflective layer on the isolation layer pattern;

forming a first photoresist layer on the first and second active regions of the substrate and the first anti-reflective layer;
partially etching the first photoresist layer to form a first photoresist pattern covering the first active region; and
implanting impurities through the first anti-reflective layer into the second active region to form a first impurity region,
wherein the forming the isolation layer pattern comprises:
forming a first trench on an upper portion of the substrate;
forming an isolation layer in the first trench to fill the first trench; and
removing an upper portion of the isolation layer to expose an upper portion of the first trench.

2. The method of claim 1, wherein the first photoresist pattern is formed to cover a portion of the first anti-reflective layer adjacent to the first active region.

3. The method of claim 1, further comprising removing the first photoresist pattern and the first anti-reflective layer.

4. The method of claim 3, further comprising:
forming a second anti-reflective layer on the isolation layer pattern;
forming a second photoresist layer on the first and second active regions of the substrate and the second anti-reflective layer;
partially etching the second photoresist layer to form a second photoresist pattern covering the second active region; and
implanting impurities into the first active region to form a second impurity region.

5. The method of claim 4, wherein the first and second impurity regions are formed to include impurities having conductivity different from each other.

6. The method of claim 1, further comprising, prior to forming the first anti-reflective layer, forming a first gate structure on the first and second active regions,
wherein the first impurity region is formed at an upper portion of the second active region adjacent to the first gate structure.

7. The method of claim 6, wherein forming the first gate structure includes forming a gate insulation layer pattern and a dummy gate electrode sequentially stacked on the first and second active regions.

8. The method of claim 7, further comprising:
forming a spacer on a sidewall of the first gate structure;
forming an insulating interlayer surrounding the first gate structure and the spacer;
removing the dummy gate electrode to form an opening exposing the gate insulation layer pattern;
forming a high-k dielectric layer pattern on the exposed gate insulation layer pattern and a sidewall of the opening; and
forming a gate electrode filling a remaining portion of the opening to form a second gate structure including the gate insulation layer pattern, the high-k dielectric layer pattern and the gate electrode sequentially stacked.

9. The method of claim 6, further comprising, after forming the first impurity region:
forming a spacer on a sidewall of the gate structure;
removing an upper portion of the second active region not covered by the first gate structure and the spacer to form a recess;
forming a source/drain layer on the recess; and
forming an elevated source drain (ESD) layer on the sour/drain layer.

10. The method of claim 9,
wherein partially etching the first photoresist layer includes performing an exposure process and a developing process on the first photoresist layer, and
wherein the exposure process is performed using KrF, ArF, extreme ultra violet (EUV), vacuum ultra violet (VUV), electron beam, X-ray, or ion beam.

11. The method of claim 1, wherein the first anti-reflective layer comprises a polymer.

12. A method of manufacturing a semiconductor device, the method comprising:
forming an anti-reflective layer on a substrate and an isolation layer pattern, the substrate including a field region and a plurality of active regions, the field region being covered by the isolation layer pattern, the plurality of active regions protruding from the isolation layer pattern;
forming a photoresist layer on the anti-reflective layer;
partially etching the photoresist layer to form a photoresist pattern covering a portion of the active regions; and
implanting impurities through the anti-reflective layer into the active regions not covered by the photoresist pattern to form an impurity region.

13. The semiconductor device of claim 12, wherein the photoresist pattern covers a portion of the anti-reflective layer adjacent to the active regions.

14. The semiconductor device of claim 12, further comprising, prior to forming the anti-reflective layer, forming a dummy gate structure including a gate insulation layer pattern and a dummy gate electrode sequentially stacked on the active regions, and
wherein the impurity region is formed at an upper portion of the active region adjacent to the dummy gate structure.

15. The method of claim 12, further comprising:
forming an isolation layer pattern on an upper portion of a substrate comprising:
forming a trench on an upper portion of the substrate;
forming an isolation layer in the trench to fill the trench; and
removing an upper portion of the isolation layer to expose an upper portion of the trench.

16. A method of manufacturing an electronic device, comprising:
forming an isolation layer pattern on a substrate;
forming a first gate structure on a first active region surrounded by the isolation layer pattern and a second gate structure on a second active region surrounded by the isolation layer pattern;
forming an anti-reflective layer on the substrate;
forming a photoresist layer on the anti-reflective layer;
removing a portion of the photoresist layer formed on a portion of the first active region to form a photoresist pattern covering the second active region; and
implanting impurities through the anti-reflective layer into the first active region,
wherein the anti-reflective layer has a thickness about 150 Å or less, and
wherein the forming the isolation layer pattern comprises:
forming a trench on an upper portion of the substrate;
forming an isolation layer in the trench to fill the trench;
removing an upper portion of the isolation layer to expose an upper portion of the trench.

17. The method of claim 16, further comprising:
exposing the photoresist layer to a light through a mask pattern,
wherein the light is extreme ultraviolet light.

18. The method of claim 16, wherein the anti-reflective layer covers the first active region during the step of implanting impurities into the first active region.

19. The method of claim 16, wherein the anti-reflective layer is formed by a gap-fill process.

20. The method of claim 16, wherein the photoresist pattern blocks the impurities during the step of implanting impurities into the first active region.

* * * * *